(12) United States Patent
Jeong et al.

(10) Patent No.: US 10,497,296 B2
(45) Date of Patent: Dec. 3, 2019

(54) OPERATIONAL AMPLIFIER CIRCUIT, DATA DRIVING CIRCUIT, AND OPERATION METHODS OF THE SAME

(71) Applicant: SAMSUNG ELECTRONICS CO., LTD., Suwon-si, Gyeonggi-Do (KR)

(72) Inventors: Ji-Yong Jeong, Seoul (KR); Jeongah Ahn, Hwaseong-si (KR); Hajun Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 11 days.

(21) Appl. No.: 15/984,587

(22) Filed: May 21, 2018

(65) Prior Publication Data
US 2019/0088183 A1 Mar. 21, 2019

(30) Foreign Application Priority Data
Sep. 21, 2017 (KR) .................. 10-2017-0122011

(51) Int. Cl.
G09G 3/20 (2006.01)
H03F 3/45 (2006.01)
H03F 3/30 (2006.01)

(52) U.S. Cl.
CPC ............... *G09G 3/20* (2013.01); *H03F 3/303* (2013.01); *H03F 3/45219* (2013.01); *H03F 3/45269* (2013.01); *G09G 2310/0291* (2013.01); *G09G 2330/021* (2013.01); *G09G 2330/028* (2013.01)

(58) Field of Classification Search
None
See application file for complete search history.

(56) References Cited

U.S. PATENT DOCUMENTS

| 5,438,286 | A | 8/1995 | Pavlin et al. |
|---|---|---|---|
| 6,456,156 | B1 | 9/2002 | Frey et al. |
| 7,280,333 | B2 | 10/2007 | Horsky et al. |
| 7,327,128 | B2 | 2/2008 | Dinh |
| 7,667,940 | B2 | 2/2010 | Turpin et al. |

(Continued)

FOREIGN PATENT DOCUMENTS

| JP | H6-104711 A | 4/1994 |
|---|---|---|
| JP | 2003-185692 A | 7/2003 |

OTHER PUBLICATIONS

"Configurable octal serial switch with open load detect current disable," NXP Semiconductors, Document No. MC33879, Rev. 11.0, Jul. 2016.

*Primary Examiner* — Duane N Taylor, Jr.
(74) *Attorney, Agent, or Firm* — Volentine, Whitt & Francos, PLLC

(57) ABSTRACT

An operational amplifier circuit includes an operational amplifier and a control circuit. The operational amplifier includes a first input terminal, a second input terminal, and an output terminal connected with the second input terminal. The operational amplifier amplifies a signal provided through the first input terminal, and outputs the amplified signal through the output terminal. The control circuit generates switching signals. In response to the switching signals, the operational amplifier resets the output terminal to a preset voltage, charges the reset output terminal, and compares a voltage of the output terminal charged with a reference voltage provided through the first input terminal to output a comparison voltage.

15 Claims, 30 Drawing Sheets

(56) References Cited

U.S. PATENT DOCUMENTS

| | | |
|---|---|---|
| 8,331,072 B1 | 12/2012 | Liu et al. |
| 8,502,463 B2 | 8/2013 | Mizukawa et al. |
| 9,480,193 B2 | 10/2016 | Vermeir et al. |
| 2005/0077957 A1* | 4/2005 | Kasai .................... G09G 3/3688 330/9 |
| 2015/0035813 A1* | 2/2015 | Lei ........................ G09G 3/3208 345/205 |
| 2015/0042631 A1* | 2/2015 | Kim ..................... G06G 3/3655 345/212 |
| 2016/0216307 A1 | 7/2016 | Sugiura et al. |
| 2019/0123761 A1* | 4/2019 | Song .................... G09G 3/3233 |

* cited by examiner

OPERATIONAL AMPLIFIER CIRCUIT, DATA DRIVING CIRCUIT, AND OPERATION METHODS OF THE SAME

CROSS-REFERENCE TO RELATED APPLICATIONS

This U.S. non-provisional patent application claims the benefit of priority under 35 U.S.C. § 119 to Korean Patent Application No. 10-2017-0122011, filed Sep. 21, 2017 in the Korean Intellectual Property Office, the disclosure of which is incorporated by reference herein in its entireties.

BACKGROUND

1. Field

Embodiments of the present disclosure described herein relate to an electronic circuit. More particularly, the present disclosure relates to an operational amplifier circuit, a data driving circuit including the same, and operation methods of the operational amplifier circuit and the data driving circuit.

2. Description of Related Art

A display device includes multiple gate lines, multiple data lines, and multiple pixels. The pixels are connected with the gate lines and the data lines. The display device further includes a gate driving circuit for controlling the gate lines and a data driving circuit for controlling the data lines.

The data driving circuit includes multiple operational amplifiers for providing data signals to the data lines. Depending on use of the display device, some of the operational amplifiers are connected with data lines, and the remaining operational amplifiers are not connected with data lines. In this case, operational amplifiers not connected with data lines oscillate, thereby having an influence on an operation of the remaining operational amplifiers. Accordingly, various ways to control operational amplifiers not connected with data lines are required.

SUMMARY

Embodiments of the present disclosure provide an operational amplifier circuit with reduced power consumption, improved performance, and improved reliability, a data driving circuit including the operational amplifier circuit, and operation methods of the operational amplifier circuit and the data driving circuit.

According to an exemplary embodiment, an operational amplifier circuit includes an operational amplifier and a control circuit. The operational amplifier includes a first input terminal, a second input terminal, and an output terminal connected with the second input terminal. The operational amplifier amplifies a signal provided through the first input terminal, and outputs the amplified signal through the output terminal. The control circuit generates multiple switching signals. In response to the switching signals, the operational amplifier resets the output terminal to a preset voltage, charges the reset output terminal, and compares a voltage of the output terminal charged with a reference voltage provided through the first input terminal to output a comparison voltage.

According to an exemplary embodiment, a data driving circuit includes a control circuit, multiple operational amplifiers, and a storage circuit. Each of the operational amplifiers resets an output terminal to a preset voltage, charges the output terminal reset, and compares a voltage of the output terminal charged with a reference voltage to output a comparison voltage, under control of the control circuit. The storage circuit stores information about the comparison voltage of each of the operational amplifiers. Based on the information stored in the storage circuit, the control circuit activates some of the operational amplifiers and deactivates the remaining operational amplifiers.

According to an exemplary embodiment, an operational amplifier circuit includes an operational amplifier and a control circuit. An operation method of the operational amplifier circuit includes resetting a voltage of an output terminal of the operational amplifier to a preset voltage, providing a current source to the output terminal to charge the output terminal, comparing a first charging voltage of the output terminal with a first reference voltage provided through an input terminal of the operational amplifier, to output a first comparison voltage, and selectively activating or deactivating the operational amplifier based on the first comparison voltage.

According to an exemplary embodiment, a data driving circuit includes multiple operational amplifiers. The operational amplifiers include output terminals. An operation method of the data driving circuit respectively includes resetting voltages of the output terminals to a preset voltage, charging the output terminals, comparing the charged voltages of the output terminals with a reference voltage to output multiple comparison voltages, storing information about the comparison voltages, and deactivating at least a part of the operational amplifiers based on the stored information.

According to an exemplary embodiment, an operational amplifier includes an input stage including first and second input terminals, an output stage including an output terminal connected with the second input terminal, a switch stage that connects the input stage and the output stage, a reset stage that resets the output terminal to a preset voltage, and a current source stage that charges the output terminal.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Figure 1:
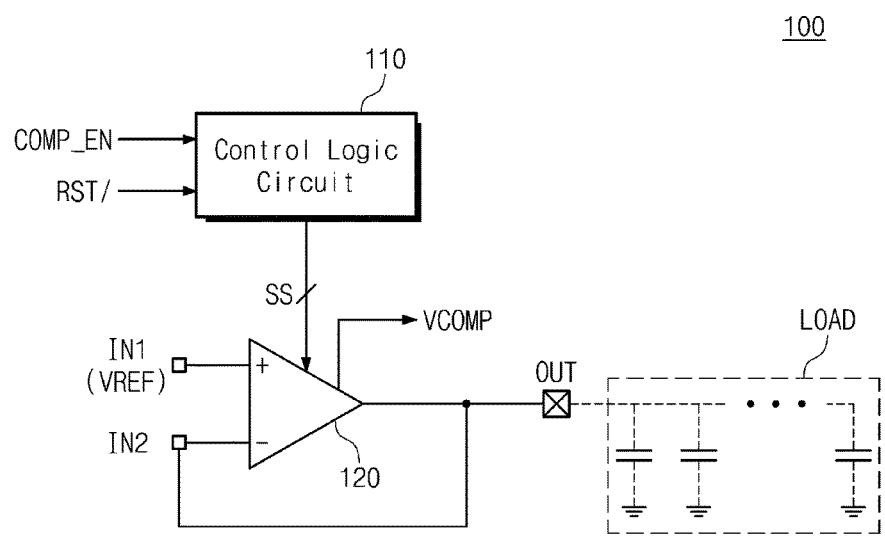
FIG. 1 is a view illustrating an operational amplifier circuit according to an exemplary embodiment of the present disclosure.

Exemplary embodiments of the present disclosure will be described in detail hereinafter with reference to the accompanying drawings. Like reference numerals may refer to like elements throughout this application. Exemplary embodiments of the present disclosure provide a computing system for providing high security and reliability of firmware by using a hardware security module and a firmware managing method thereof.

FIG. 1 is a view illustrating an operational amplifier circuit according to an exemplary embodiment of the present disclosure. Referring to FIG. 1, an operational amplifier circuit 100 may include a control logic circuit 110 and an operational amplifier 120. The control logic circuit 110 may provide multiple switching signals SS to the operational amplifier 120 in response to control signals. For example, control signals from an external device to the control logic circuit 110 may include a comparison signal COMP_EN and a reset signal RST/.

The operational amplifier 120 may include first input terminal IN1 and second input terminal IN2 and an output terminal OUT. The output terminal OUT may be connected to the second input terminal IN2 to form a feedback loop.

The output terminal OUT of the operational amplifier 120 may be connected with a load or may not be connected therewith.

In an exemplary embodiment, the load illustrated in FIG. 1 may be pixels or a data line(s) included in a display panel such as of an external display device. However, the scope and spirit of the present disclosure may not be limited thereto. Also, the output terminal OUT of the operational amplifier 120 is illustrated in FIG. 1 as being connected with the load. However, the output terminal OUT of the operational amplifier 120 may be in a state (i.e., no-load state or an open load state) where connection with the load is not made.

Below, for convenience of description, a state where a load is not connected to the output terminal OUT may be referred to as "no load state". A state where a load is connected to the output terminal OUT may be referred to as a "load state".

The operational amplifier 120 according to the present disclosure may determine whether the output terminal OUT is in the load state or in no-load state, in response to the switching signals SS from the control logic circuit 110 and may output a comparison voltage VCOMP as the determination result.

For example, the operational amplifier 120 may reset a voltage of the output terminal OUT to a preset voltage (e.g., a ground voltage GND) in response to the switching signals SS. Afterwards, the operational amplifier 120 may output a preset current to the output terminal OUT in response to the switching signals SS. Afterwards, the operational amplifier 120 may compare the voltage of the output terminal OUT and a reference voltage VREF provided to the first input terminal IN1 and may output the comparison voltage VCOMP as the comparison result.

In an exemplary embodiment, in the case where the output terminal OUT is in the load state, the voltage of the output terminal OUT may be slowly charged due to influence of the load. In contrast, in the case where the output terminal OUT is in no-load state, the voltage of the output terminal OUT may be charged more quickly than in the load state. That is, the operational amplifier 120 may compare the voltage of the output terminal OUT and the reference voltage VREF to output the comparison voltage VCOMP representing whether the output terminal OUT is in the load state or in no-load state.

As described above, the operational amplifier circuit 100 according to the present disclosure may determine whether the output terminal OUT is in the load state or in no-load state, by resetting the output terminal OUT in response to the switching signals SS from the control logic circuit 110; charging (or discharging) the output terminal OUT; and comparing a voltage of the output terminal OUT and the reference voltage VREF. That is, whether the output terminal OUT is in the load state or in no-load state may be detected without a separate additional circuit.

Figure 2:
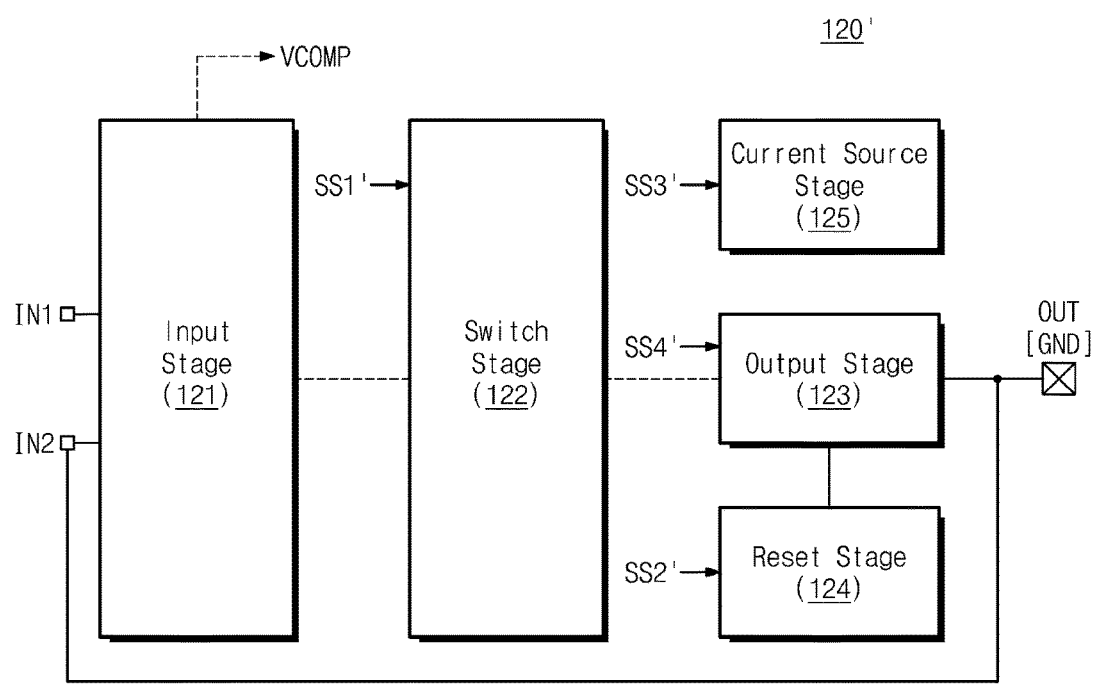
FIGS. 2, 3 and 4 are block diagrams illustrating an operational amplifier of FIG. 1 in detail.
Figure 3:
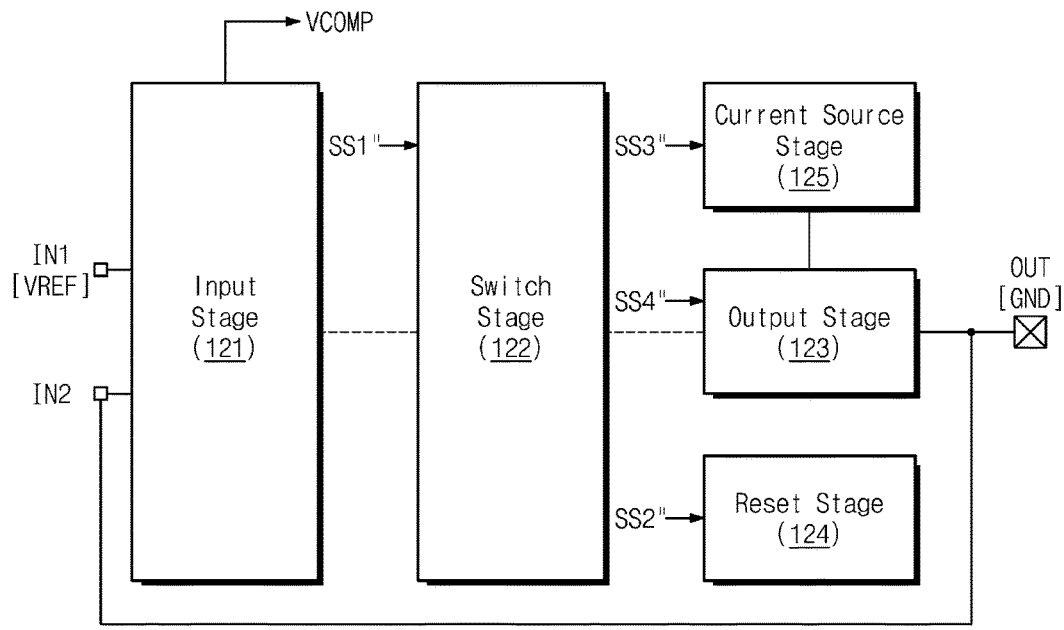
Figure 4:
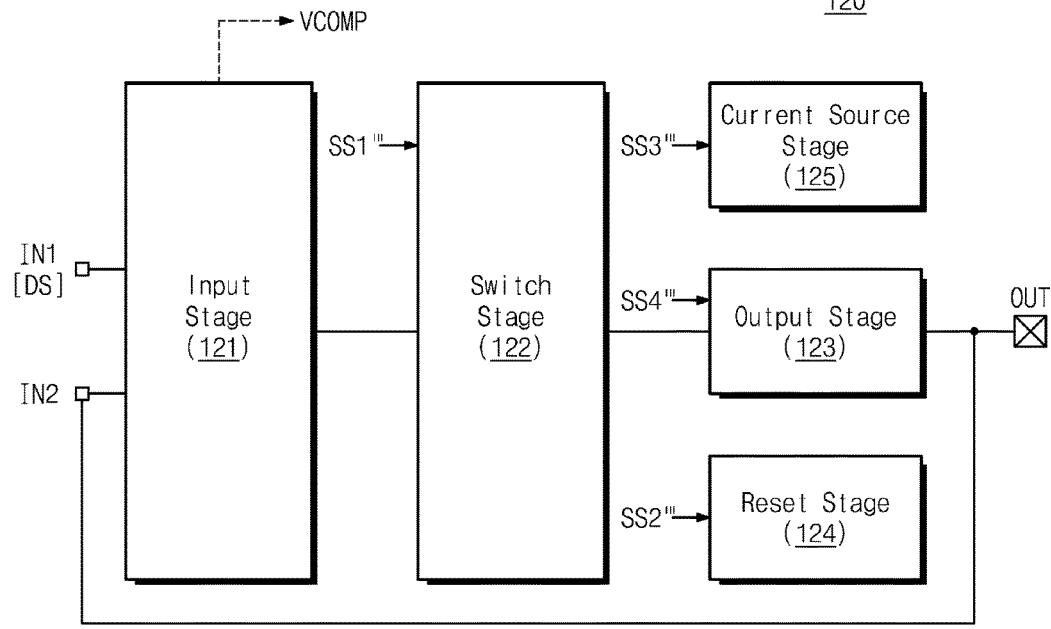

FIGS. 2 to 4 are block diagrams illustrating an operational amplifier of FIG. 1 in detail. Referring to FIGS. 1 to 4, the operational amplifier 120 may include an input stage 121, a switch stage 122, an output stage 123, a reset stage 124, and a current source stage 125.

The input stage 121 is configured to receive an input signal or an input voltage from the outside through the first input terminal IN1 and second input terminal IN2. In an exemplary embodiment, the second input terminal IN2 may be connected to the output terminal OUT to form a feedback loop. The input stage 121 may provide corresponding control signals to the output stage 123 through the switch stage 122 based on input signals provided through the first input terminal and second input terminal IN2. The output stage 123 may be configured to output an output voltage in response to the control signals provided from the input stage through the switch stage 122.

The switch stage 122 may be configured to provide a switching function between the input stage 121 and the output stage 123 in response to the switching signals SS. For example, each of the switch stage 122, the output stage 123, the reset stage 124, and the current source stage 125 may include one or more switches that operate in response to the switching signals SS.

As illustrated in FIG. 2, the switch stage 122 may actively disconnect or not connect the input stage 121 and the output stage 123 in response to first switching signals SS1'. That is the switch stage 122 may allow the input stage 121 and the output stage 123 not to be connected with each other in response to first switching signals SS1'. In this case, the current source stage 125 may cut off connection with the output stage 123 in response to a third switching signal SS3'. The reset stage 124 may be configured to reset the output terminal OUT to the preset voltage in response to second switching signals SS2'. For example, the reset stage 124 may be connected with the output stage 123 in response to second switching signals SS2', thus resetting the output terminal OUT to a preset voltage (e.g., the ground voltage GND). Below, for a brief description, an operation illustrated in FIG. 2 is referred to as a "reset operation".

Afterwards, in response to the switching signals SS, the current source stage 125 may charge (or discharge) a voltage of the output terminal OUT. The input stage 121 may compare the voltage of the output terminal OUT and the reference voltage VREF to output the comparison voltage VCOMP.

For example, as illustrated in FIG. 3, the switch stage 122 may actively disconnect or not connect the input stage 121 and the output stage 123 in response to first switching signals SS1'. That is the switch stage 122 may allow the input stage 121 and the output stage 123 not to be connected with each other in response to first switching signals SS1". The reset stage 124 may cut off connection with the output stage 123 in response to second switching signals SS2". The current source stage 125 may be connected with the output stage 123 in response to second switching signals SS3" so as to charge the output terminal OUT as a charged output terminal. The voltage of the output terminal OUT charged by the current source stage 125 may be provided to the second input terminal IN2. The input stage 121 may compare the voltage of the output terminal OUT and the reference voltage VREF provided through the first input terminal IN1 and may output the comparison voltage VCOMP as the comparison result. Below, for a brief description, an operation illustrated in FIG. 3 is referred to as a "comparison operation".

Afterwards, the switch stage 122 may connect the input stage 121 and the output stage 123 in response to the switching signals SS. In this case, the input stage 121 and the output stage 123 may be configured to amplify a signal (e.g., a data signal DS) provided through the first input terminal IN1 and output the amplified signal through the output terminal OUT.

For example, as illustrated in FIG. 4, the switch stage 122 may connect the input stage 121 and the output stage 123 in response to first switching signals SS1'''. The reset stage 124 may cut off connection with the output stage 123 in response to a second switching signal SS2'''. The current source stage 125 may cut off connection with the output stage 123 in response to third switching signals SS3'''. In this case, the output stage 123 may be configured to output an output voltage through the output terminal OUT based on a signal from the input stage 121. In an exemplary embodiment, the output voltage provided through the output terminal OUT may be provided to the second input terminal IN2 through the feedback loop. Below, for a brief description, an operation illustrated in FIG. 4 is referred to as a "normal operation".

In an exemplary embodiment, in the respective operations, the output stage 123 may perform corresponding operations in response to fourth switching signals SS4', SS4", and SS4'''. An operation of switches included in the output stage 123 will be more fully described with reference to the following drawings.

In an exemplary embodiment, as described above, a level of the comparison voltage VCOMP may vary depending on the load state or no-load state of the output terminal OUT. The control logic circuit 110 may be configured to control the operational amplifier 120 based on the comparison voltage VCOMP. For example, the control logic circuit 110 may determine whether the output terminal OUT of the operational amplifier 120 is in the load state or in no-load state, based on the comparison voltage VCOMP. The control logic circuit 110 may selectively activate or deactivate the operational amplifier 120 based on the determination result.

In an exemplary embodiment, the activated operational amplifier 120 may be provided with active bias signals so as to perform the normal operation as illustrated in FIG. 4. The deactivated operational amplifier 120 may be provided with an inactive bias signal such that the deactivated operational amplifier 120 does not have an electrical influence on a peripheral circuit or power consumption is minimized. In an exemplary embodiment, the active bias signals may refer to signals that enable, instruct or otherwise cause or allow the operational amplifier 120 to perform the normal operation. The inactive bias signals may refer to signals that enable, instruct or otherwise cause electrical or electronic elements in the operational amplifier 120 not to operate. That is, the inactive bias signals may be used to disable the electrical or electronic elements in the operational elements in the operational amplifier 120, or otherwise cause or allow the electrical or electronic elements in the operational amplifier not to operate.

As described above, the operational amplifier circuit 100 according to the present disclosure may detect the load state or no-load state of the output terminal OUT without a separate additional circuit. The operational amplifier 120 may be activated or deactivated based on the detection result. Accordingly, an operational amplifier circuit with improved reliability and reduced power consumption is provided.

FIGS. 5 to 8B are circuit diagrams and equivalent circuit diagrams illustrating a detailed configuration of the operational amplifier 120 of FIG. 1. To describe the technical aspects of the present disclosure easily, exemplary circuit diagrams and equivalent circuit diagrams of an operational amplifier are illustrated in FIGS. 5 to 8B. However, the scope and spirit of the present disclosure may not be limited thereto. For example, a structure of the operational amplifier according to the present disclosure may be variously changed without departing from the technical aspects of the present disclosure.

In an exemplary embodiment, an exemplary structure of the operational amplifier 120 according to the present disclosure will be described with reference to FIG. 5. A reset operation of the operational amplifier 120 will be described with reference to FIGS. 6A and 6B. A comparison operation of the operational amplifier 120 will be described with reference to FIGS. 7A and 7B. A normal operation of the operational amplifier 120 will be described with reference to FIGS. 8A and 8B.

Also, for brevity of illustration, switching signals SS respectively corresponding to multiple switches SW1 to SW9 included in the operational amplifier 120 are not illustrated in drawings. However, each of the switches SW1 to SW9 may be turned on or turned off in response to a relevant switching signal among the switching signals SS from the control logic circuit 110.

Figure 5:
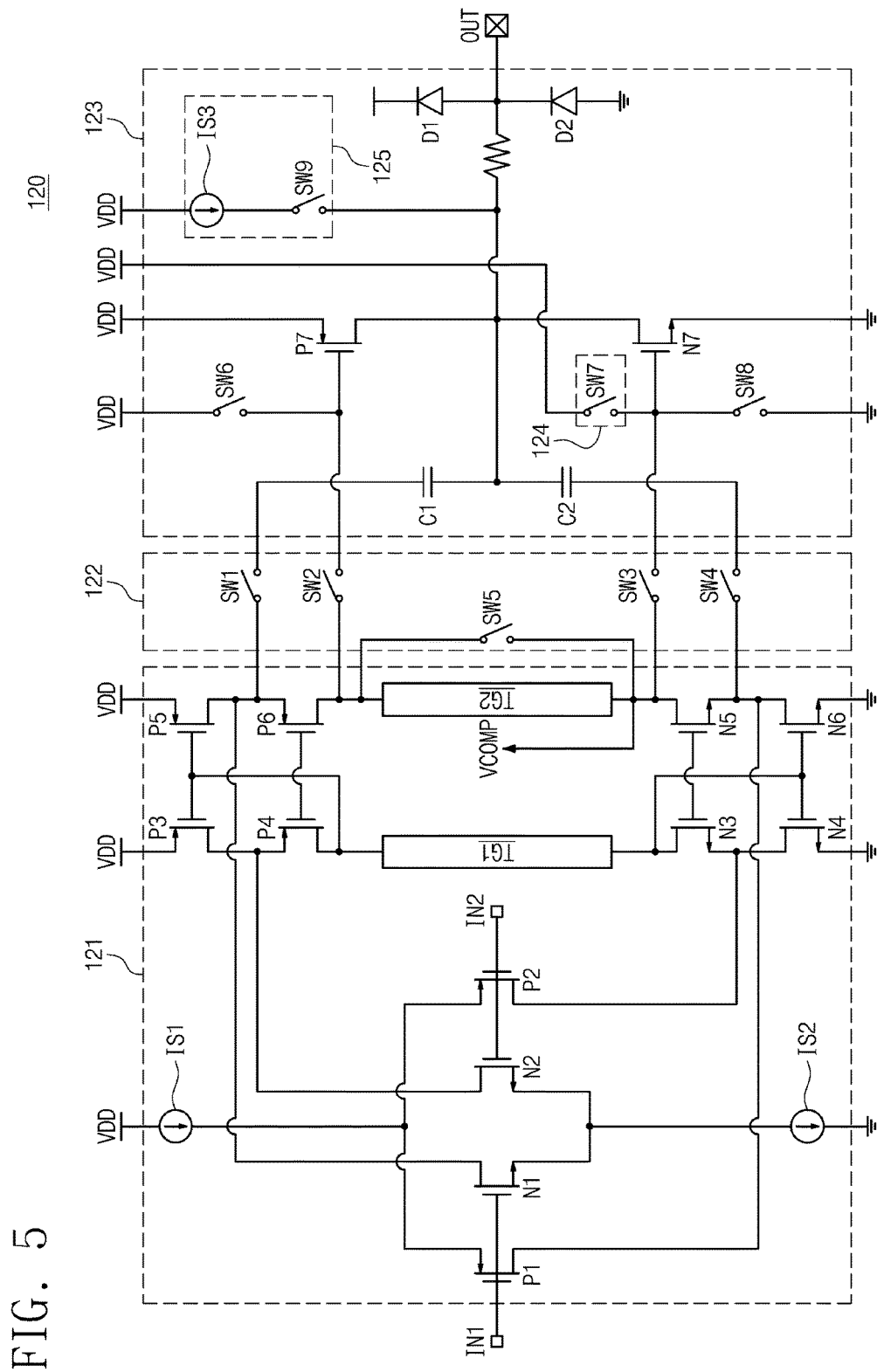
FIGS. 5, 6A, 6B, 7A, 7B, 8A and 8B are circuit diagrams and equivalent circuit diagrams illustrating a detailed configuration of the operational amplifier of FIG. 1.
Figure 6A:
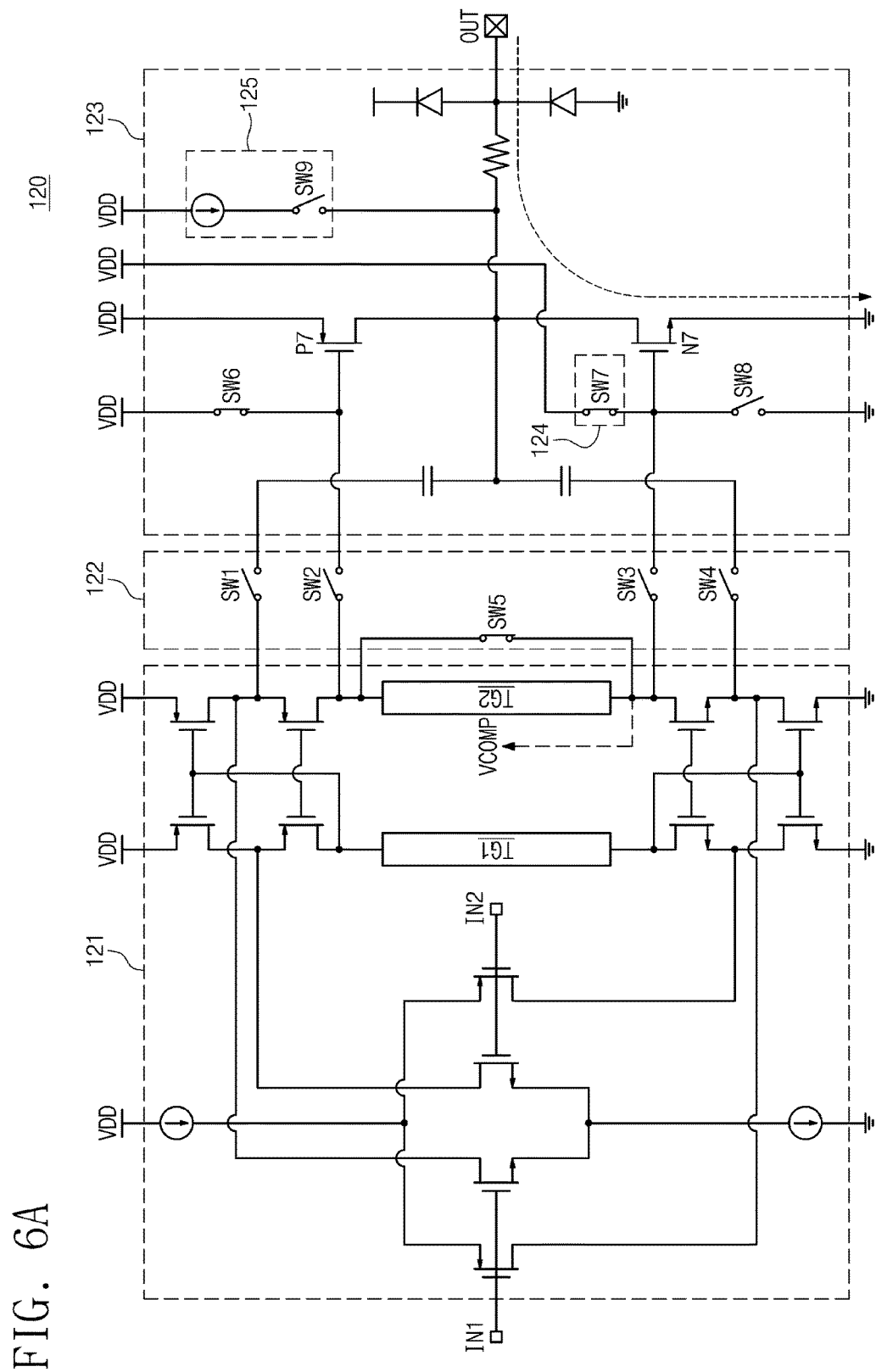
Figure 7A:
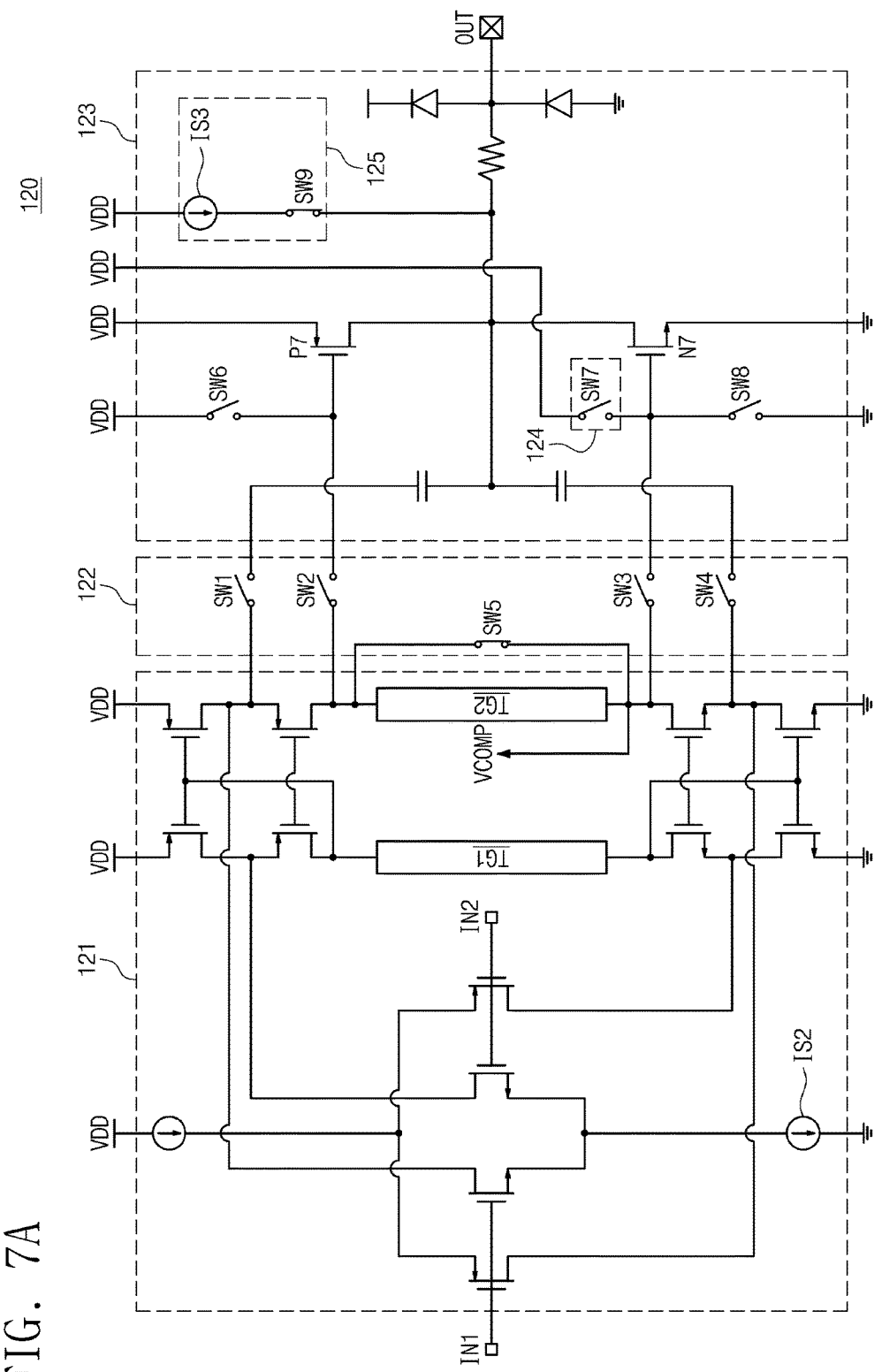
Figure 8A:
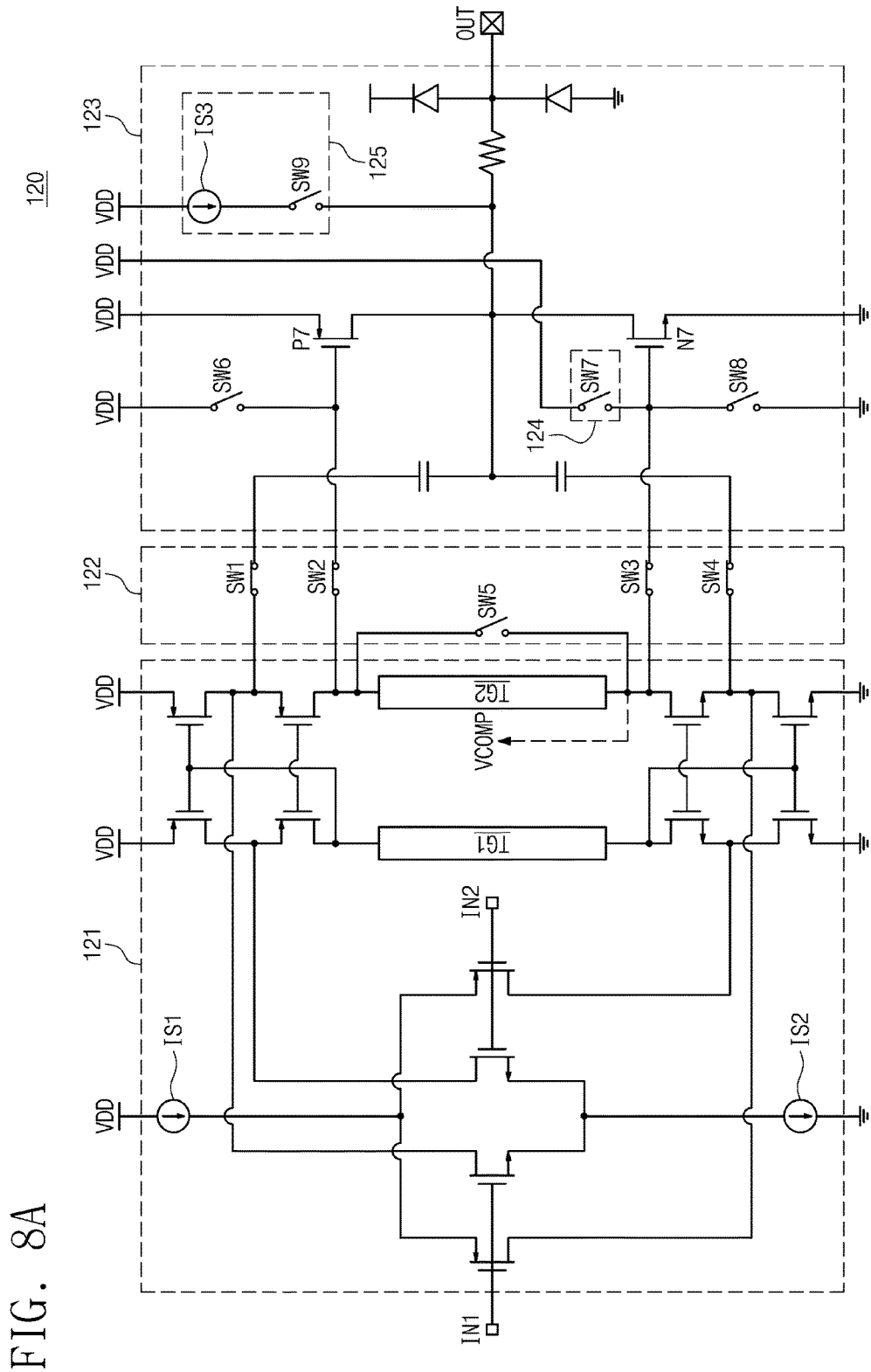
Figure 8B:
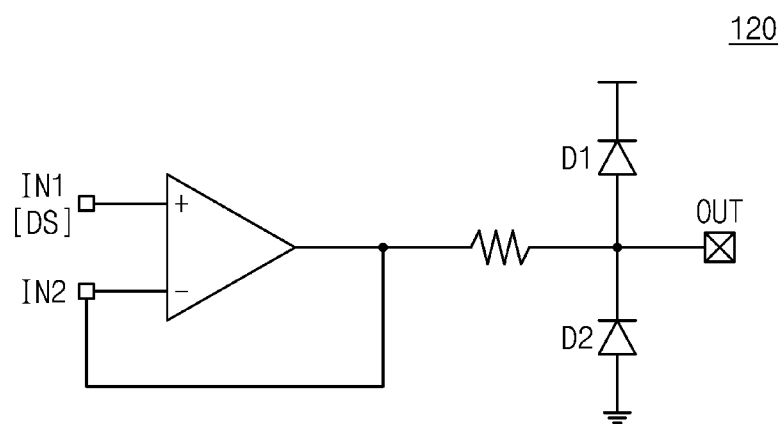

Also, for brevity of illustration, a reference numeral of each component such as a transistor or a current source is illustrated in FIG. 5, and an unnecessary reference numeral of each component is omitted in FIGS. 6A, 7A, and 8B.

Also, for brevity of illustration, the second input terminal IN2 and the output terminal OUT are illustrated as being separated from each other. However, it should be understood that the second input terminal IN2 and the output terminal OUT are or may be connected with each other to form a feedback loop.

Referring to FIGS. 1 and 5, the operational amplifier 120 may include the input stage 121, the switch stage 122, the output stage 123, the reset stage 124, and the current source stage 125.

The input stage 121 may include first PMOS transistor P1 to sixth PMOS transistor P6, first NMOS transistor N1 to sixth NMOS transistor N6, first current source IS1 and second current source IS2, and first transmission gate TG1 and second transmission gate TG2.

The first PMOS transistor P1 and second PMOS transistor P2 may be respectively gated by voltages of the first input terminal IN1 and second input terminal IN2 to generate signals based on the first current source IS1. A signal from the first PMOS transistor P1 is provided to a node between the fifth NMOS transistor N5 and the sixth NMOS transistor N6 of the input stage 121. A signal from the second PMOS transistors P2 is provided to a node between third NMOS transistor N3 and fourth NMOS transistor N4 of the input stage 121.

The first NMOS transistor N1 and second NMOS transistor N2 may be respectively gated by voltages of the first input terminal IN1 and second input terminal IN2 to generate signals based on the second current source IS2. A signal from the first NMOS transistor N1 is provided to a node between the fifth PMOS transistor P5 and sixth PMOS transistor P6 of the input stage 121. A signal from the second NMOS transistors N2 is provided to a node between third PMOS transistor P3 and fourth PMOS transistor P4 of the input stage 121.

The third and fourth PMOS transistors P3 and P4 are connected in series between a power supply voltage VDD and a first terminal of the first transmission gate TG1. The fifth and sixth PMOS transistors P5 and P6 are connected in series between the power supply voltage VDD and a first terminal of the second transmission gate TG2. Gates of the third and fifth PMOS transistors P3 and P5 are connected to the first terminal of the first transmission gate TG1. Gates of the fourth and sixth PMOS transistors P4 and P6 are connected with each other.

The third and fourth NMOS transistors N3 and N4 are connected in series between a second terminal of the first transmission gate TG1 and a ground voltage GND. The fifth and sixth NMOS transistors N5 and N6 are connected in series between a second terminal of the second transmission gate TG2 and the ground voltage GND. Gates of the fourth and sixth NMOS transistors N4 and N6 are connected to the second terminal of the first transmission gate TG1. Gates of the third and fifth NMOS transistors N3 and N5 are connected with each other.

The switch stage 122 may include first switch SW1 to fifth switch SW5. The first switch SW1 to fourth switch SW4 may provide a switching function between the input stage 121 and the output stage 123. The fifth switch SW5 is configured to connect opposite ends of the second transmission gate TG2.

In more detail, the first switch SW1 is configured to connect the node between the fifth PMOS transistor P5 and sixth PMOS transistor P6 and the output stage 123. The second switch SW2 is configured to connect the first terminal of the second transmission gate TG2 and the output stage 123. The third switch SW3 is configured to connect the second terminal of the second transmission gate TG2 and the output stage 123. The fourth switch SW4 is configured to connect the node between the fifth NMOS transistor N5 and sixth NMOS transistor N6 and the output stage 123. That is, switching may be made between the input stage 121 and the output stage 123 through the first switch SW1 to fourth switch SW4.

The output stage 123 may include sixth switch and eighth switch SW8, first capacitor C1 and second capacitor C2, a seventh PMOS transistor P7, a seventh NMOS transistor N7, and first diode D1 and second diode D2.

The first capacitor C1 is connected between the first switch SW1 and the output terminal OUT. The second capacitor C2 is connected between the fourth switch SW4 and the output terminal OUT.

The seventh PMOS transistor P7 is connected between the power supply voltage VDD and the output terminal OUT and operates in response to a signal from the second switch SW2. In an exemplary embodiment, the seventh PMOS transistor P7 may be a pull-up transistor. The seventh NMOS transistor N7 is connected between the output terminal OUT and the ground voltage GND and operates in response to a signal from the third switch SW3. In an exemplary embodiment, the seventh NMOS transistor N7 may be a pull-down transistor.

The first diode D1 is connected between the power supply voltage VDD and the output terminal OUT. The second diode D2 is connected between the output terminal OUT and the ground voltage GND.

The sixth switch SW6 is configured to connect the power supply voltage VDD and a gate of the seventh PMOS transistor P7. The eighth switch SW8 is a reset switch configured to connect a gate of the seventh NMOS transistor N7 and the ground voltage GND.

The reset stage 124 may include a seventh switch SW7. The seventh switch SW7 is configured to connect the power supply voltage VDD and the gate of the seventh NMOS transistor N7. When the seventh switch SW7 is turned on, a voltage of the output terminal OUT may be reset to a preset voltage (e.g., the ground voltage GND).

The current source stage 125 may include a third current source IS3 and a ninth switch SW9. The third current source IS3 is connected between the power supply voltage VDD and the output terminal OUT. The ninth switch SW9 is configured to connect the third current source IS3 and the output terminal OUT. When the ninth switch SW9 is turned on, the output terminal OUT may be charged as a charged output terminal.

The above-described structure or configuration of the operational amplifier 120 according to an exemplary embodiment of the present disclosure is an example, and the scope and spirit of the present disclosure is not limited thereto. A structure of the operational amplifier 120, and a connection relationship of components of the operational amplifier 120, etc. may be variously changed. Also, PMOS transistors, NMOS transistors, switches, or current sources may be changed to various elements.

Figure 6B:
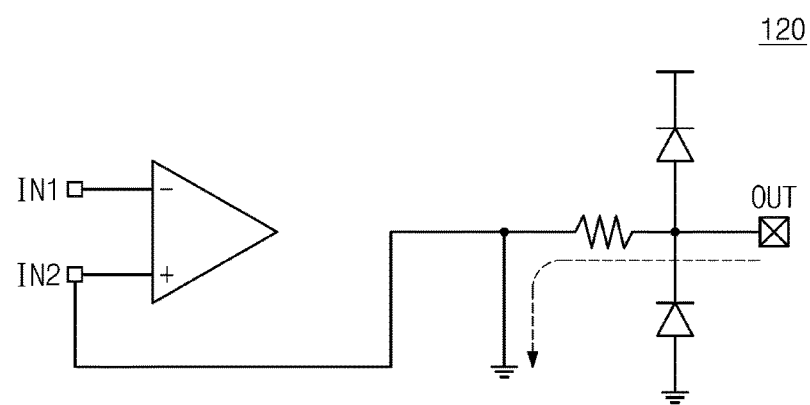

Below, a reset operation of the operational amplifier 120 will be described with reference to FIGS. 6A and 6B. Referring to FIGS. 1, 6A, and 6B, the reset operation may be performed as the first switch SW1 to ninth switch SW9 are turned on or turned off in response to the switching signals SS from the control logic circuit 110.

For example, as illustrated in FIG. 6A, in response to the switching signals SS, the first switch SW1 to fourth switch SW4 of the switch stage 122 are turned off, and the fifth switch SW5 is turned on. The ninth switch SW9 of the current source stage 125 is turned off in response to the switching signals SS. In response to the switching signals SS, the eighth switch SW8 of the output stage 123 is turned off, and the sixth switch SW6 of the output stage 123 and the seventh switch SW7 of the reset stage 124 are turned on. In an exemplary embodiment, through the above-described operation of the switches, the input stage 121 and the output stage 123 may be separated from each other, the output stage 123 and the current source stage 125 may be separated from each other, and the output stage 123 and the reset stage 124 may be connected with each other.

As the output stage 123 and the reset stage 124 are connected with each other, a current path may be formed through the seventh NMOS transistor N7. As such, a voltage level of the output terminal OUT may be reset to a preset voltage (e.g., the ground voltage GND). That is, the output stage 123 and the reset stage 124 may be connected with each other, and thus, the output terminal OUT may be reset to the ground voltage GND. In an exemplary embodiment, a circuit diagram illustrated in FIG. 6B may be an equivalent circuit diagram associated with the circuit diagram illustrated in FIG. 6A.

That is, in the reset operation of the operational amplifier 120, the input stage 121 and the output stage 123 may be separated from each other by the first switch SW1 to fourth switch SW4 of the switch stage 122, and the sixth switch SW6 and seventh switch SW7 may be turned on. According to this operation condition, a voltage of the output terminal OUT may be reset to a preset voltage (e.g., the ground voltage GND) through a current path from the output terminal OUT to the ground voltage GND.

Figure 7B:
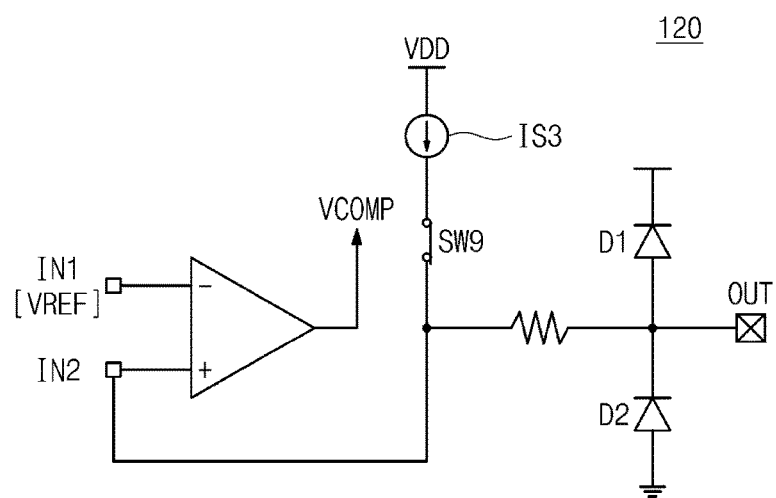

Below, a comparison operation of the operational amplifier 120 will be described with reference to FIGS. 7A and 7B. Referring to FIGS. 1, 7A, and 7B, the comparison operation may be performed as the first switch SW1 to ninth switch SW9 are turned on or turned off in response to the switching signals SS from the control logic circuit 110.

For example, as illustrated in FIG. 7A, in response to the switching signals SS, the first switch SW1 to fourth switch SW4 of the switch stage 122 are turned off, and the fifth switch SW5 is turned on. In response to the switching signals SS, the sixth switch SW6 and eighth switch SW8 of the output stage 123 are turned off, the seventh switch SW7 of the reset stage 124 is turned off, and the ninth switch SW9 of the current source stage 125 is turned on. In other words, through the above-described operation of the switches, the input stage 121 and the output stage 123 may be separated from each other, the output stage 123 and the reset stage 124 may be separated from each other, and the output stage 123 and the current source stage 125 may be connected with each other.

As the output stage 123 and the current source stage 125 are connected with each other, the output terminal OUT may be charged as a charged output terminal by the third current source IS3. Since the output terminal OUT forms the feedback loop with the second input terminal IN2, the input stage 121 may compare a charging voltage of the output terminal OUT and the reference voltage VREF to output the comparison voltage VCOMP. In an exemplary embodiment, a circuit diagram illustrated in FIG. 7B may be an equivalent circuit diagram associated with the circuit diagram illustrated in FIG. 7A.

In an exemplary embodiment, as described above, in the case where the output terminal OUT is in the load state (i.e., in the case where a load is connected to the output terminal OUT), the charging voltage may be lower than the reference voltage VREF or may be slowly charged. In contrast, in the case where the output terminal OUT is in no-load state (i.e., in the case where a load is not connected to the output terminal OUT), the charging voltage may be higher than the reference voltage VREF or may be quickly charged. That is, the comparison voltage VCOMP may include information about whether the output terminal OUT is in the load state or in no-load state.

In an exemplary embodiment, information about the comparison voltage VCOMP may be stored in a separate storage circuit (not illustrated). The control logic circuit 110 may selectively activate or deactivate the operational amplifier 120 based on the value stored in the separate storage circuit.

Below, a normal operation of the operational amplifier 120 will be described with reference to FIGS. 8A and 8B. Referring to FIGS. 1, 8A, and 8B, the normal operation may be performed as the first switch SW1 to ninth switch SW9 are turned on or turned off in response to the switching signals SS from the control logic circuit 110.

For example, as illustrated in FIG. 8A, in response to the switching signals SS, the fifth switch SW5 of the switch stage 122 is turned off, and the first switch to fourth switch SW4 are turned on. The sixth to ninth switches SW6 to SW9 are tuned off. In other words, through the above-described operation of the switches, the input stage 121 and the output stage 123 may be connected with each other, the output stage 123 and the reset stage 124 may be separated from each other, and the output stage 123 and the current source stage 125 may be separated from each other.

As the input stage 121 and the output stage 123 are connected with each other, the operational amplifier 120 may amplify a signal provided through the first input terminal IN1 and may output the amplified signal through the output terminal OUT. That is, the operational amplifier 120 may perform the normal operation. In an exemplary embodiment, a circuit diagram illustrated in FIG. 8B may be an equivalent circuit diagram associated with the circuit diagram illustrated in FIG. 8A. In an exemplary embodiment, the operational amplifier 120 may receive the data signal DS, may amplify the received data signal DS, and may output the amplified data signal DS to the output terminal OUT. In more detail, the operational amplifier 120 may receive the data signal DS through a data line of a display device such as an external display device, may amplify the received data signal DS, and may output the amplified data signal DS to the output terminal OUT.

In an exemplary embodiment, the normal operation of the operational amplifier 120 described with reference to FIG. 8A may be a normal operation of the activated operational amplifier 120. In an exemplary embodiment, as described above, in the case where the output terminal OUT is in no-load state, the operational amplifier 120 may be deactivated. In this case, as illustrated in FIG. 5, all switches of the operational amplifier 120 may be turned off, or an inactive bias signal may be provided such that elements included in the operational amplifier 120 do not operate. As a result, the output terminal OUT of the deactivated operational amplifier 120 may be in a high-impedance state (a Hi-Z state) characterized by a high impedance in which, for example, no signal is driven from the operational amplifier 120.

Figure 9:
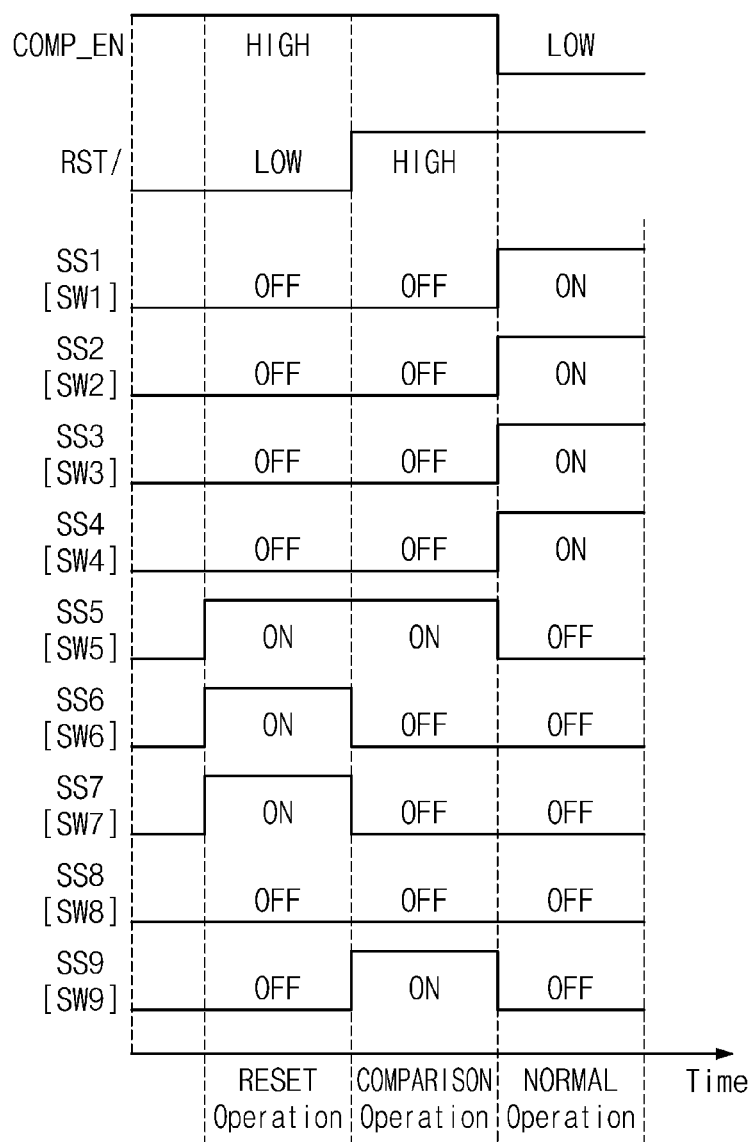
FIG. 9 is a timing diagram illustrating multiple switching signals for controlling first to ninth switches included in the operational amplifier of FIG. 5.

FIG. 9 is a timing diagram illustrating multiple switching signals for controlling first to ninth switches included in an operational amplifier of FIG. 5. For brevity of illustration, respective signals are schematically illustrated, but the scope and spirit of the present disclosure is not limited thereto. Below, for convenience of description, a description will be given as a specific signal or a specific voltage is a HIGH level or a LOW level. This may be a logical value simply representing a state of a specific signal or a specific voltage. Also, it may be understood that a level of a specific signal or a specific voltage is variously changed according to a way to implement the present disclosure.

Referring to FIGS. 1, 5, and 9, the control logic circuit 110 may generate first switching signal SS1 to ninth switching signal SS9 in response to the comparison signal COMP_EN and the reset signal RST/. In an exemplary embodiment, the first switch SW1 to ninth switch SW9 of FIG. 5 may operate in response to the first switching signal SS1 to ninth switching signal SS9, respectively.

In the case where the comparison signal COMP_EN is the HIGH level and the reset signal RST/is the LOW level, the control logic circuit 110 may output the first switching signal SS1 to ninth switching signal SS9 such that the operational amplifier 120 performs a reset operation. For example, the control logic circuit 110 may output the first switching signal SS1 to ninth switching signal SS9 such that the first switch SW1 to fourth switch SW4, the eighth switch SW8, and the ninth switch SW9 are turned off and the fifth switch SW5 to seventh switch SW7 are turned on. The operational amplifier 120 may perform the reset operation in response to the first switching signal SS1 to ninth switching signal SS9.

Next, in the case where the comparison signal COMP_EN and the reset signal RST/ all are the HIGH level, the control logic circuit 110 may output the first to ninth switching signals SS1 to SS9 such that the operational amplifier 120 performs a comparison operation. For example, the control logic circuit 110 may output the first to ninth switching signals SS1 to SS9 such that the first to fourth switches SW1 to SW4 and sixth to eighth switches SW6 to SW8 are turned off and the fifth and ninth switches SW5 and SW9 are turned on. The operational amplifier 120 may perform the comparison operation in response to the first switching signal SS1 to ninth switching signal SS9.

Next, in the case where the comparison signal COMP_EN is the LOW level and the reset signal RST/is the HIGH level, the control logic circuit 110 may output the first switching signal SS1 to ninth switching signal SS9 such that the operational amplifier 120 performs a normal operation. For example, the control logic circuit 110 may output the first switching signal SS1 to ninth switching signal SS9 such that the first switch SW1 to fourth switch SW4 are turned on and the fifth switch SW5 to ninth switch SW9 are turned off. The operational amplifier 120 may perform the normal operation in response to the first switching signal SS1 to ninth switching signal SS9.

Figure 10:
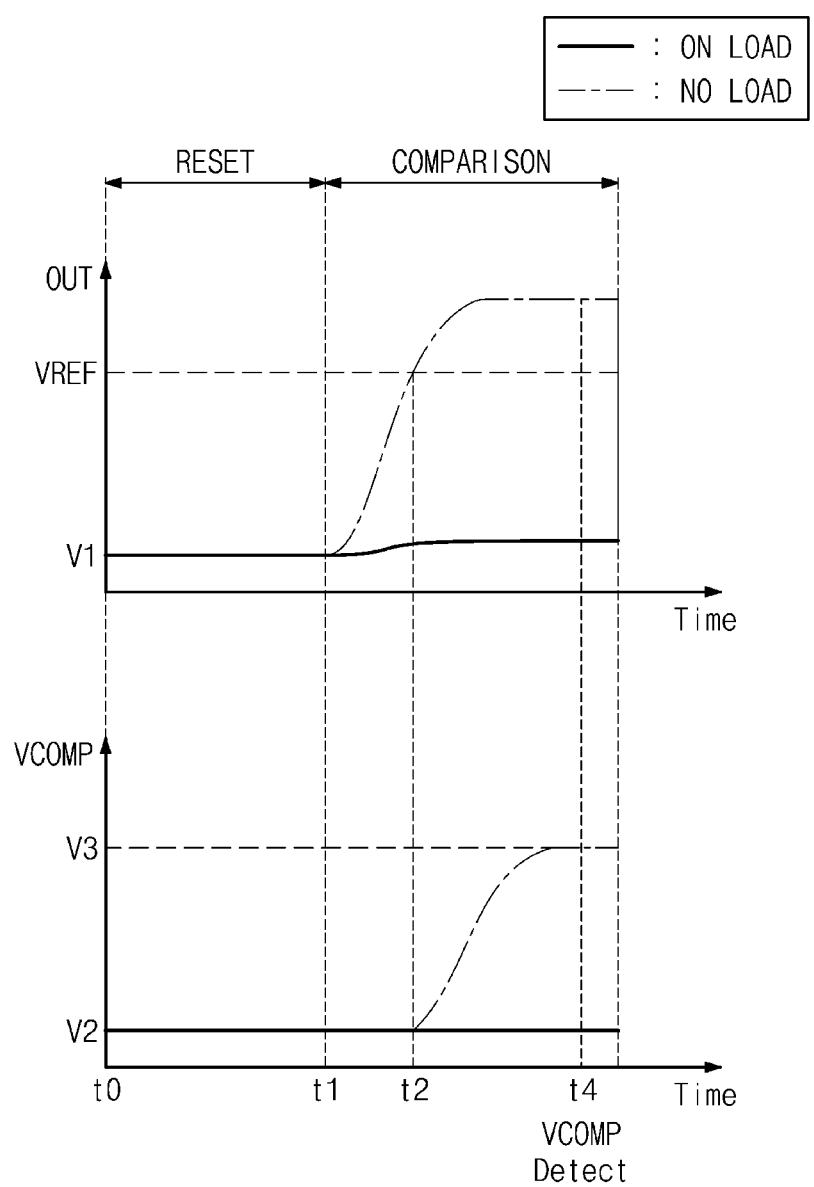
FIG. 10 is a graph illustrating a change in a voltage of an output terminal and a change in a comparison voltage according to a load state or no-load state of the output terminal in a comparison operation of the operational amplifier.

FIG. 10 is a graph illustrating a change in a voltage of an output terminal and a change in a comparison voltage according to a load state or no-load state of the output terminal in a comparison operation of an operational amplifier. In an exemplary embodiment, in graphs of FIG. 10, each X-axis denotes a time, and Y-axes denote a voltage of the output terminal OUT and the comparison voltage VCOMP, respectively.

Referring to FIGS. 1 and 10, during a time interval from t0 to t1, the operational amplifier 120 may perform a reset operation RESET in response to the switching signals SS from the control logic circuit 110. According to the reset operation, a voltage of the output terminal OUT may be set to a first voltage V1 (or the ground voltage GND), and the comparison voltage VCOMP may be set to a second voltage V2. In an exemplary embodiment, the second voltage V2 may be a low level.

Afterwards, the operational amplifier 120 may perform a comparison operation COMPARISON in response to the switching signals SS from the control logic circuit 110. As described above, during the comparison operation, the output terminal OUT may be charged as a charged output terminal by a current source. In this case, if the output terminal OUT is in no-load state (i.e., in the case where a load is not connected thereto), as illustrated by dotted lines in the graphs of FIG. 10, a voltage of the output terminal OUT may quickly increase. A voltage of the output terminal OUT of no-load state may be higher than the reference voltage VREF. In this case, the comparison voltage VCOMP output from the operational amplifier 120 may start to increase at t2 and may reach a third voltage V3 at t4. In an exemplary embodiment, the third voltage V3 may be a high level.

In contrast, if the output terminal OUT is in the load state (i.e., in the case where a load is connected thereto), as illustrated by solid lines in the graphs of FIG. 10, a voltage of the output terminal OUT may slowly increase. At t2 or t4, a voltage of the output terminal OUT connected with a load may be lower than the reference voltage VREF. In this case, the comparison voltage VCOMP may maintain the second voltage V2.

That is, whether the output terminal OUT of the operational amplifier 120 is in the load state or in no-load state may be detected by storing or obtaining the comparison voltage VCOMP from the operational amplifier 120 at t4.

Figure 11A:
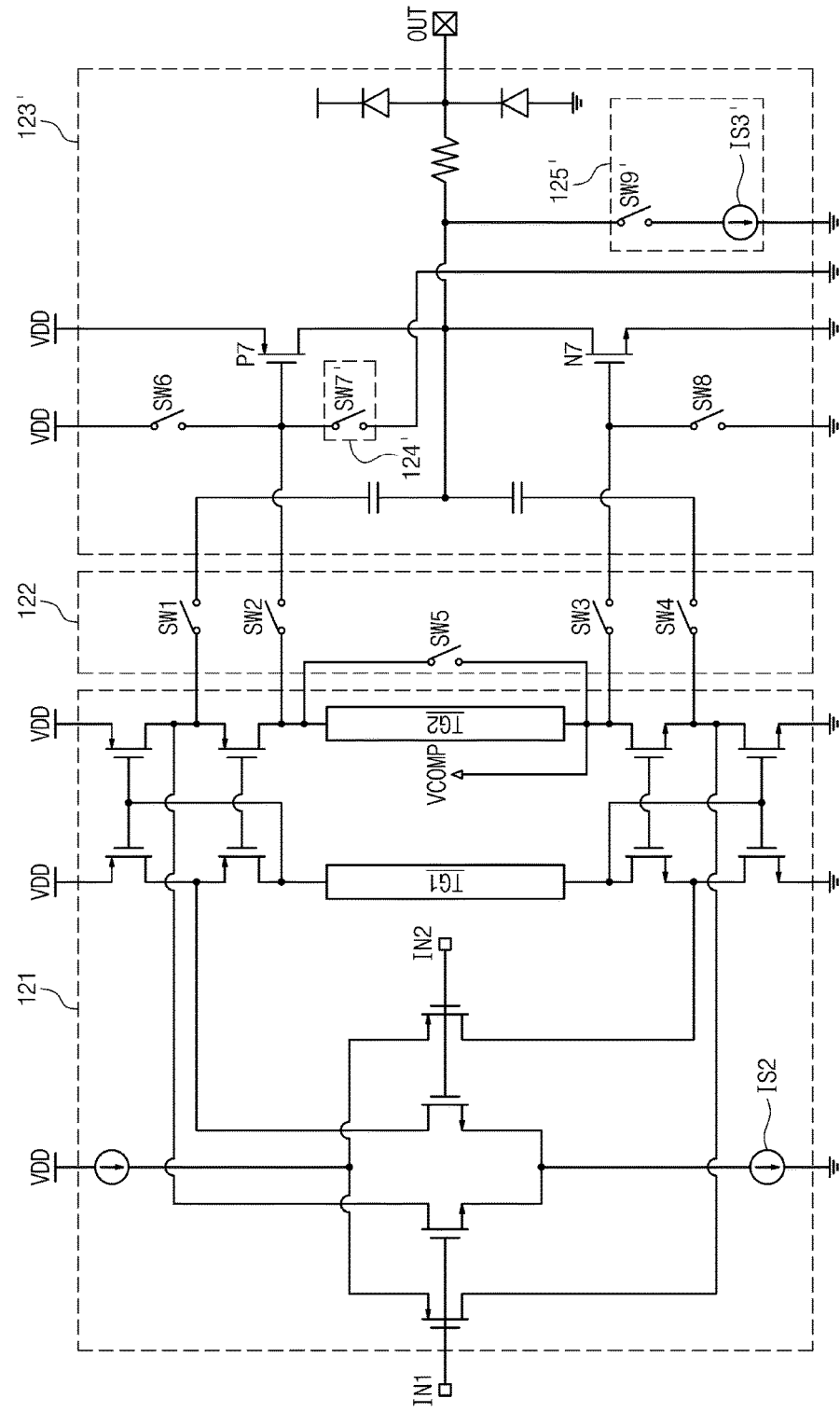
FIG. 11A is a circuit diagram illustrating the operational amplifier of FIG. 1.
Figure 11B:
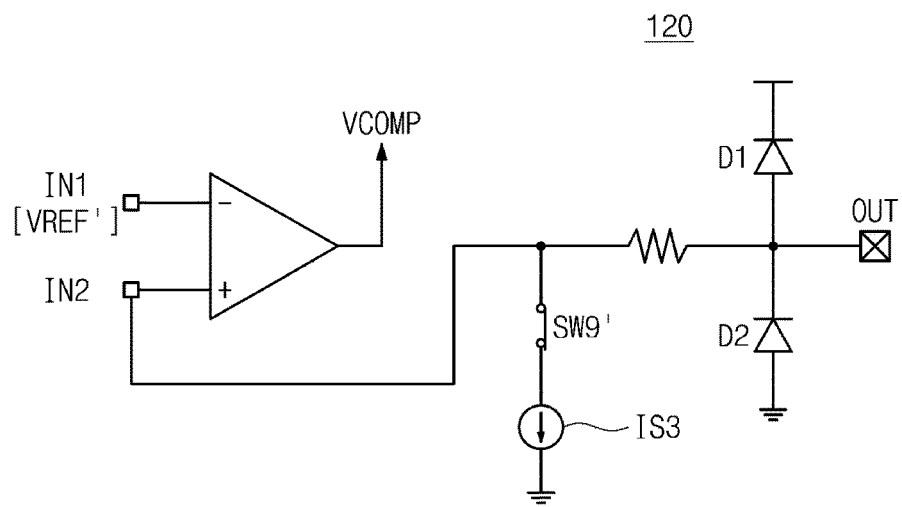
FIG. 11B is an equivalent circuit diagram in the case where an operational amplifier of FIG. 11A performs a comparison operation.
Figure 11C:
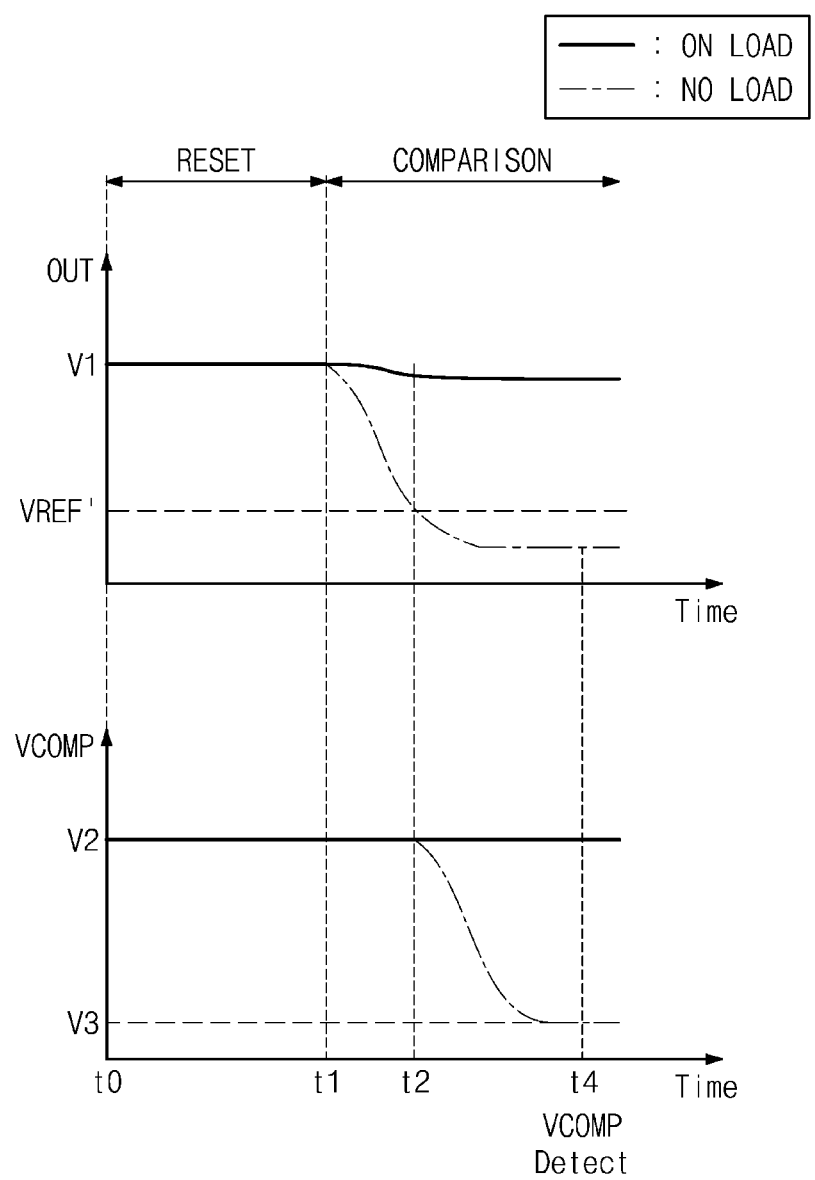
FIG. 11C illustrates changes in an output voltage and a comparison voltage according to a reset operation and a comparison operation of the operational amplifier of FIG. 11A.

FIG. 11A is a circuit diagram illustrating an operational amplifier of FIG. 1. FIG. 11B is an equivalent circuit diagram in the case where an operational amplifier 120' of FIG. 11A performs a comparison operation. FIG. 11C illustrates changes in the output voltage OUT and the comparison voltage VCOMP according to a reset operation and a comparison operation of the operational amplifier 120' of FIG. 11A. For convenience of description, a description of components given with reference to FIG. 5 will not be repeated here, and a difference between the operational amplifier 120' of FIG. 11A and the operational amplifier 120 of FIG. 5 will be focused on.

Referring to FIGS. 11A to 11C, the operational amplifier 120' may include the input stage 121, the switch stage 122, the output stage 123, a reset stage 124', and a current source stage 125'. The input stage 121, the switch stage 122, and the output stage 123 are the same as those of FIG. 5, and thus, a detailed description thereof will not be repeated here.

Unlike the reset stage 124 of FIG. 5, the reset stage 124' of FIG. 11A may include a seventh switch SW7' configured to connect the gate of the seventh PMOS transistor P7 and the ground voltage GND. That is, the reset stage 124' of FIG. 11A may include the seventh switch SW7' for gating the seventh PMOS transistor P7.

Unlike the current source stage 125 of FIG. 5, the current source stage 125' of FIG. 11A includes a third current source IS3' connected between the output terminal OUT and the ground voltage GND and a ninth switch SW9' configured to connect the third current source IS3' and the output terminal OUT. The ninth switch SW9' is thus a charging switch. That is, the current source stage 125' of FIG. 11A may discharge the output terminal OUT to the ground voltage GND.

For example, the operational amplifier 120 of FIG. 5 may reset the output terminal OUT to the ground voltage GND in a reset operation and may charge the output terminal OUT by providing a current source to the output terminal OUT in a comparison operation. In contrast, the operational amplifier 120' of FIG. 11A may be configured to charge the output terminal OUT as a charged output terminal with the power supply voltage VDD in the reset operation and to discharge a voltage of the output terminal OUT to the ground voltage GND in the comparison operation.

In other words, as illustrated in FIG. 11B, in the comparison operation, the operational amplifier 120' may be configured to discharge a voltage of the output terminal OUT to the ground voltage GND through the ninth switch SW9' and the third current source IS3' of the current source stage 125'. The circuit diagram of FIG. 11B is an equivalent circuit diagram associated with FIG. 11A.

As illustrated in FIG. 11C, the output terminal OUT may be charged with the first voltage V1 (e.g., the power supply voltage VDD) during the reset operation and may be discharged to the ground voltage GND during the comparison operation. In this case, at t4, the comparison voltage VCOMP may be set to the second voltage V2 or the third voltage V3 depending on the load state or no-load state of the output terminal OUT. In an exemplary embodiment, the second voltage V2 may be a high level, and the third voltage V3 may be a low level. Accordingly, whether a load is connected to the output terminal OUT of the operational amplifier 120' may be detected by storing or obtaining the comparison voltage VCOMP at t4.

Figure 12:
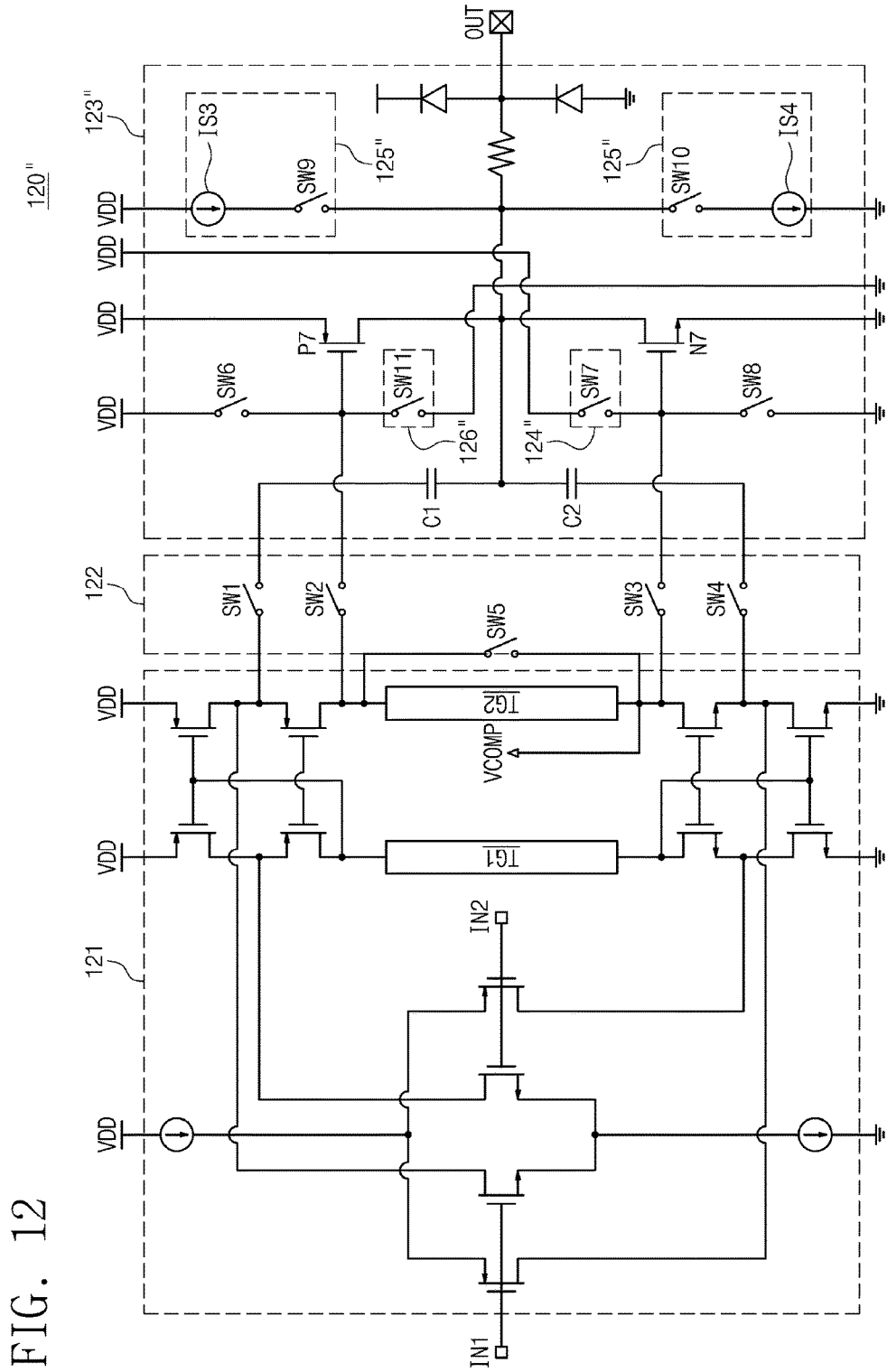
FIG. 12 is a circuit diagram illustrating an embodiment of the operational amplifier of FIG. 1.

FIG. 12 is a circuit diagram illustrating an embodiment of an operational amplifier of FIG. 1. Referring to FIG. 12, an operational amplifier 120" may include the input stage 121, the switch stage 122, the output stage 123, a reset stage 124", and a current source stage 125". Configurations of the input stage 121, the switch stage 122, and the output stage 123 are the same as those of FIG. 5, and thus, a detailed description thereof will not be repeated here.

In addition to the configuration of the reset stage 124 of FIG. 5, the reset stage 124" of FIG. 12 may further include an eleventh switch SW11 that connects the output terminal OUT and the gate of the seventh PMOS transistor P7. In addition to the configuration of the current source stage 125 of FIG. 5, the current source stage 125" of FIG. 12 may further include a fourth current source IS4 connected between the output terminal OUT and the ground voltage GND and a tenth switch SW10 configured to connect the output terminal OUT and the fourth current source IS4.

In an exemplary embodiment, the operational amplifier 120" of FIG. 12 may turn on the sixth and seventh switches SW6 and SW7 to perform a first reset operation and may turn on the eighth switch SW8 (i.e., the reset switch) and the eleventh switch SW8 to perform a second reset operation. The output terminal OUT may be reset to the ground voltage GND in the first reset operation and may be reset to the power supply voltage VDD in the second reset operation.

In the operational amplifier 120" of FIG. 12, the output terminal OUT may be charged as a charged output terminal through the third current source IS3 by turning on the ninth switch SW9 after the first reset operation. The output terminal OUT may be discharged through the fourth current source IS4 by turning on the tenth switch SW10 after the second reset operation.

That is, the operational amplifier 120" of FIG. 12 may perform the reset and comparison operations described with reference to FIG. 5 by using the seventh, eighth, and ninth switches SW7, SW8, and SW9 and the third current source IS3 and may perform the reset and comparison operations described with reference to FIG. 11A by using the eighth, tenth, and eleventh switches SW8, SW10, and SW11 and the fourth current source IS4. In an exemplary embodiment, the operational amplifier 120" of FIG. 12 may repeatedly perform the above-described reset and comparison operations, thereby improving the accuracy to detect the load state or no-load state of the output terminal OUT.

Figure 13:
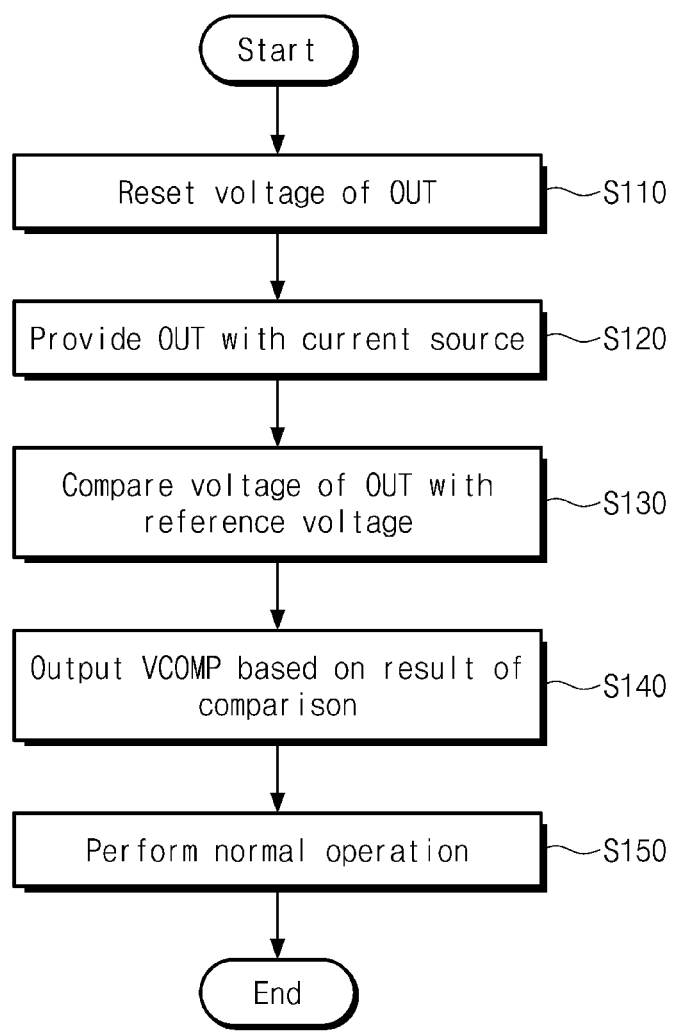
FIG. 13 is a flowchart illustrating an operation of the operational amplifier circuit of FIG. 1.

FIG. 13 is a flowchart illustrating an operation of an operational amplifier circuit of FIG. 1. For a brief description, an operation method of the operational amplifier circuit 100 of FIG. 1 is described. However, the scope and spirit of the present disclosure may not be limited thereto. For example, any operational amplifier circuit including the operational amplifier 120' of FIG. 11A or the operational amplifier 120" of FIG. 12 may operate based on a similar operation method.

Referring to FIGS. 1 and 13, in operation S110, the operational amplifier circuit 100 may reset the output terminal OUT. For example, as described with reference to FIG. 2, 6, 11A, or 12, the control logic circuit 110 may generate the switching signals SS used for the operational amplifier 120 to perform a reset operation. The operational amplifier 120 may reset a voltage of the output terminal OUT to a preset voltage (e.g., the ground voltage GND or the power supply voltage VDD) in response to the switching signals SS.

In operation S120, the operational amplifier circuit 100 may provide a current source to the output terminal OUT. For example, as described with reference to FIG. 3, 7, 11A, or 12, the control logic circuit 110 may generate the switching signals SS for charging or discharging the output terminal OUT through the current source. The operational amplifier 120 may charge or discharge the output terminal OUT through the current source in response to the switching signals SS.

In operation S130, the operational amplifier circuit 100 may compare a voltage of the output terminal OUT and the reference voltage VREF. For example, as described with reference to FIG. 3, 7, or 11A, the reference voltage VREF may be provided to the first input terminal IN1 of the operational amplifier 120, and the output terminal OUT and the second input terminal IN2 may form a feedback loop. The operational amplifier 120 may compare the reference voltage VREF and the voltage of the output terminal OUT.

In operation S140, the operational amplifier circuit 100 may output the comparison voltage VCOMP based on the comparison result. For example, as described with reference to FIG. 3, 7, or 11C, the operational amplifier 120 may output the comparison voltage VCOMP of a high level if the voltage of the output terminal OUT is higher than the reference voltage VREF and may output the comparison voltage VCOMP of a low level if the voltage of the output terminal OUT is lower than the reference voltage VREF.

In an exemplary embodiment, as described with reference to FIG. 3 or 7, in the case where the output terminal OUT is reset to the ground voltage GND and is charged as a charged output terminal by a current source, the comparison voltage VCOMP of the high level may represent no-load state of the output terminal OUT, and the comparison voltage VCOMP of the low level may represent the load state of the output terminal OUT. Alternatively, as described with reference to FIG. 11C, in the case where the output terminal OUT is reset to the power supply voltage VDD and is discharged by a current source, the comparison voltage VCOMP of the high level may represent the load state of the output terminal OUT, and the comparison voltage VCOMP of the low level may represent no-load state of the output terminal OUT.

In an exemplary embodiment, the control logic circuit 110 may detect the load state or no-load state of the output terminal OUT based on the comparison voltage VCOMP.

In operation S150, the operational amplifier circuit 100 may perform a normal operation. For example, as described with reference to FIGS. 4 and 9, the control logic circuit 110 may generate multiple switching signals such that the operational amplifier 120 performs the normal operation. As described with reference to FIG. 4, the operational amplifier 120 may perform the normal operation in response to the switching signals SS. In this case, the control logic circuit 110 may selectively activate or deactivate the operational amplifier 120 depending on the load state or no-load state of the output terminal OUT of the operational amplifier 120.

Figure 14:
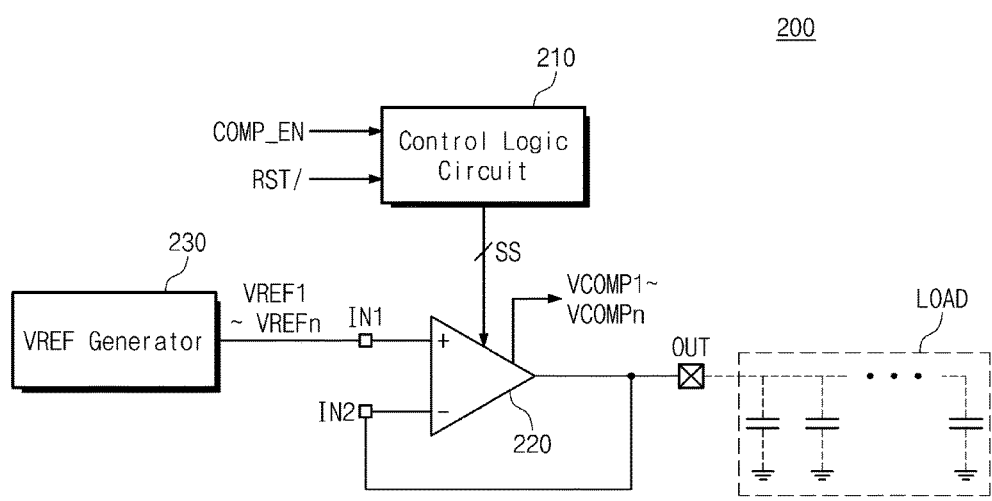
FIG. 14 is a view illustrating the operational amplifier circuit according to an exemplary embodiment of the present disclosure.

FIG. 14 is a view illustrating an operational amplifier circuit according to an exemplary embodiment of the present disclosure. Referring to FIG. 14, an operational amplifier circuit 200 may include a control logic circuit 210, an operational amplifier 220, and a reference voltage generator 230. The control logic circuit 210 and the operational amplifier 220 are described above, and thus, a detailed description thereof will not be repeated here.

The reference voltage generator 230 may generate various reference voltages VREF for detecting the load state or no-load state of the output terminal OUT of the operational amplifier 220. The operational amplifier 220 may perform the comparison operation described with reference to FIGS. 1 to 13 by using the various reference voltages VREF from the reference voltage generator 230.

For example, the operational amplifier 220 may compare a first reference voltage VREF1 and a voltage of the output terminal OUT and may output a first comparison voltage VCOMP1 as the comparison result. The operational amplifier 220 may compare a second reference voltage VREF2 different from the first reference voltage VREF1 and the voltage of the output terminal OUT and may output a second comparison voltage VCOMP2 as the comparison result. In an exemplary embodiment, the operational amplifier 220 may compare the voltage of the output terminal OUT with respective reference voltages VREF1 to VREFn to output comparison voltages VCOMP1 to VCOMPn. The control logic circuit 210 may improve the accuracy to detect the load state or no-load state of the output terminal OUT of the operational amplifier 220 based on the comparison voltages VCOMP1 to VCOMPn.

In an exemplary embodiment, in addition to detecting the load state or no-load state of the output terminal OUT, the control logic circuit 210 may calculate the amount of load connected to the output terminal OUT of the operational amplifier 220 based on the comparison voltages VCOMP1 to VCOMPn. An operation of calculating the amount of load will be described with reference to FIGS. 17 and 18.

Figure 15:
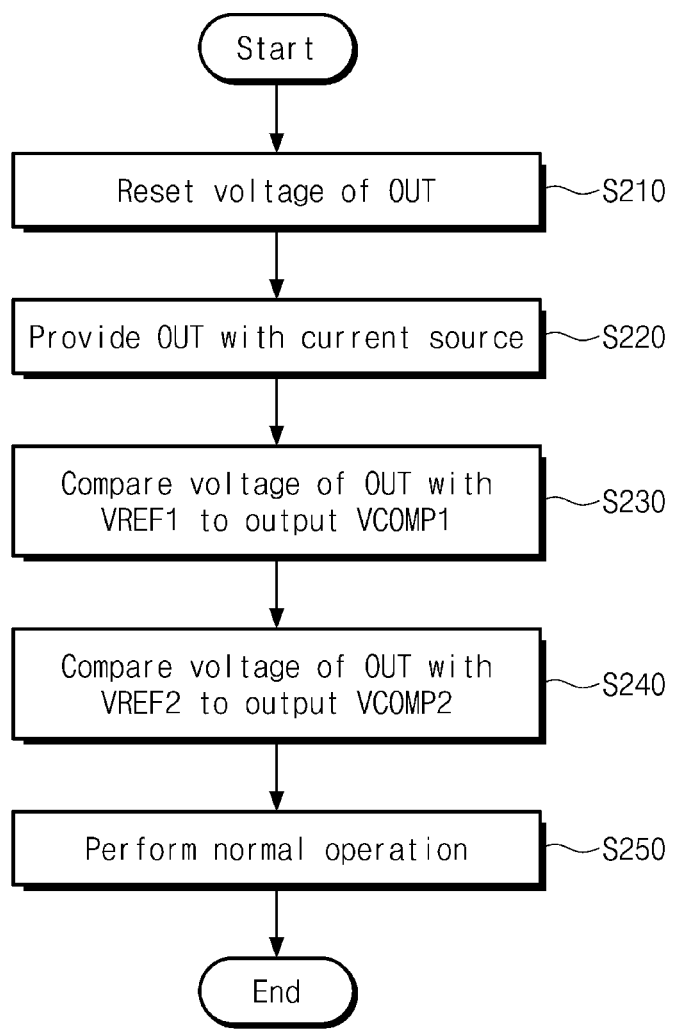
FIG. 15 is a flowchart for describing an operation of the operational amplifier of FIG. 14.
Figure 16:
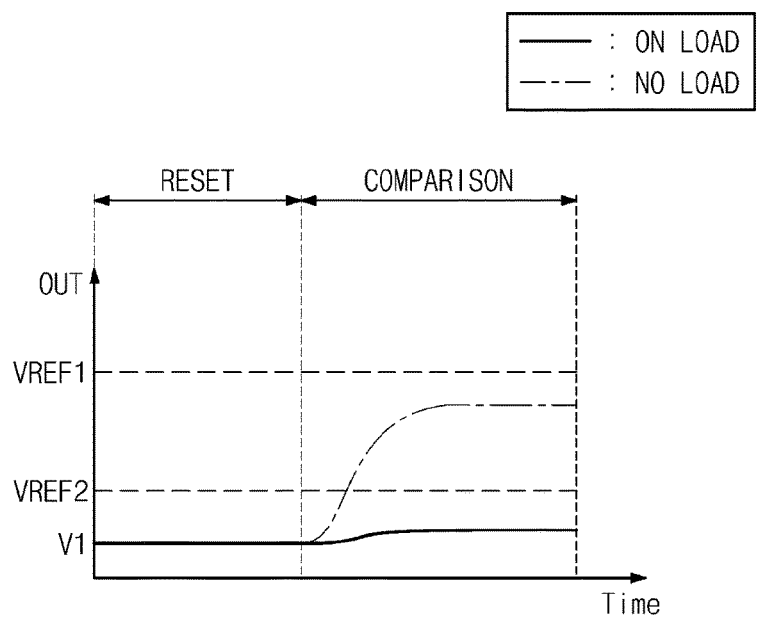
FIG. 16 illustrates graphs for describing an operation of the operational amplifier of FIG. 14.

FIG. 15 is a flowchart for describing an operation of an operational amplifier of FIG. 14. FIG. 16 illustrates graphs for describing an operation of an operational amplifier of FIG. 14. In graphs of FIG. 16, an X-axis denotes a time, and a Y-axis denotes a voltage of the output terminal OUT.

Referring to FIGS. 14 to 16, the operational amplifier 220 may perform operation S210 and operation S220. Operation S210 and operation S220 may be similar to operation S110 and operation S120 of FIG. 13, and thus, a detailed description thereof will not be repeated here.

In operation S230, the operational amplifier 220 may compare a voltage of the output terminal OUT and the first reference voltage VREF1 to output the first comparison voltage VCOMP1. In operation S240, the operational amplifier 220 may compare the voltage of the output terminal OUT and the second reference voltage VREF2 to output the second comparison voltage VCOMP2. In an exemplary embodiment, the first reference voltage VREF1 and second reference voltage VREF2 may be voltages that are generated from the reference voltage generator 230 and have different levels.

For example, as described with reference to FIG. 10, in the comparison operation, since the output terminal OUT of no-load state is sharply charged and is higher than the reference voltage VREF, the comparison voltage VCOMP of a high level may be output. Since the output terminal OUT of the load state is slowly charged and is lower than the reference voltage VREF, the comparison voltage VCOMP of a low level may be output. In this case, it may be possible to detect the load state or no-load state of the output terminal OUT of the operational amplifier 120 exactly by using one reference voltage VREF.

In contrast, as illustrated in FIG. 16, even though the output terminal OUT is in no-load state, the output terminal OUT may not be charged as a charged output terminal with a voltage higher than the first reference voltage VREF1 due to various factors. In this case, if the comparison operation is performed only by using the first reference voltage VREF1, a comparison voltage of a low level may be output regardless of the load state or no-load state of the output terminal OUT. For this reason, the load state or no-load state of the output terminal OUT may not be detected accurately.

According to an exemplary embodiment of FIG. 16, a comparison operation may be performed multiple times by using the first reference voltage VREF1 and second reference voltage VREF2, thereby improving the accuracy to detect the load state or no-load state. For example, as illustrated in FIG. 16, the first comparison voltage VCOMP1 based on the first reference voltage VREF1 may be a low level regardless of the load state. In contrast, the second comparison voltage VCOMP2 based on the second reference voltage VREF2 may be a high level in no-load state and may be a low level in the load state. That is, the operational amplifier 220 may perform the comparison operation by using multiple reference voltages, and thus, the accuracy to detect a load connected with the output terminal OUT may be improved.

In operation S250, the operational amplifier 220 may perform a normal operation under control of the control logic circuit 210. Operation S250 is similar to operation S150 of FIG. 13, and thus, a detailed description thereof will not be repeated here.

Figure 17:
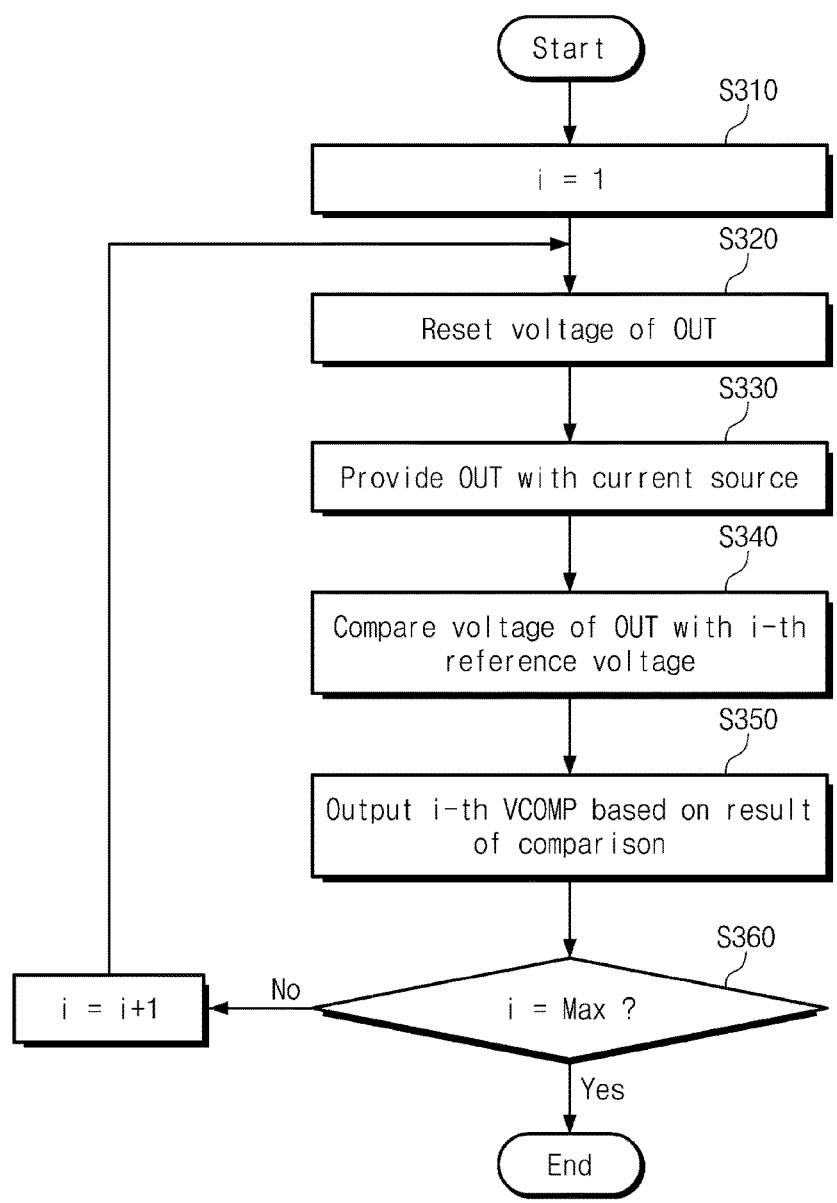
FIG. 17 is a flowchart for describing an operation of the operational amplifier of FIG. 14.
Figure 18:
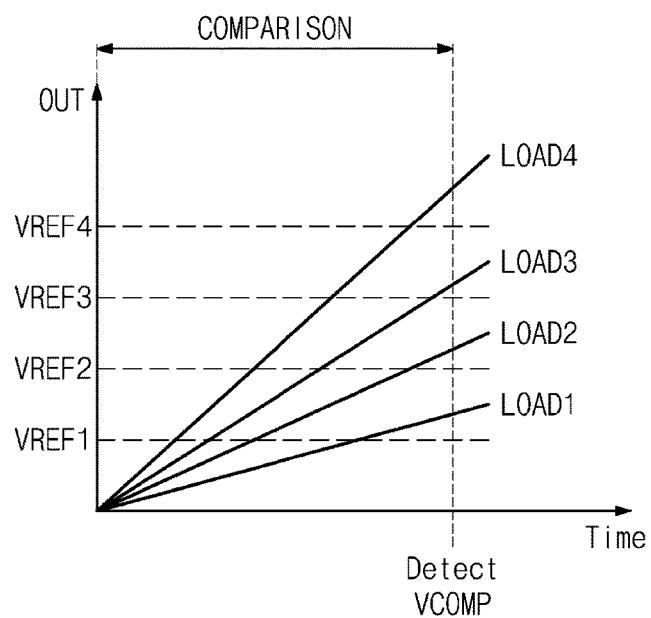
FIG. 18 illustrates graphs for describing an operation of the operational amplifier of FIG. 14.

FIG. 17 is a flowchart for describing an operation of an operational amplifier of FIG. 14. FIG. 18 illustrates graphs for describing an operation of an operational amplifier of FIG. 14. Referring to FIGS. 14, 17, and 18, in operation S310, a variable "i" is set to "1". In an exemplary embodiment, the variable "i" used in FIG. 17 is for describing an iterative operation according to the present disclosure simply, not limiting the scope and spirit of the present disclosure.

The operational amplifier 220 may perform operation S320 and operation S330. Operation S320 and operation S330 are similar to operation S110 and operation S120 of FIG. 13, and thus, a detailed description thereof will not be repeated here.

In operation S340, the operational amplifier 220 compares a voltage of the output terminal OUT and an i-th reference voltage (i.e., the first reference voltage VREF1). In operation S350, the operational amplifier 220 output an i-th comparison voltage (i.e., the first comparison voltage VCOMP1) based on the comparison result. In operation S360, whether the variable "i" is a maximum value is determined. In the case where the variable "i" is not a maximum value, "i" increases by "1", and operation S320 to operation S350 are performed. In the case where the variable "i" is a maximum value, the reset and comparison operations of the operational amplifier 220 end.

In an exemplary embodiment, through the above-described iterative operation, a comparison operation may be performed with the respective reference voltages VREF1 to VREFn, and the comparison voltages VCOMP1 to VCOMPn may be output as the respective comparison results.

In an exemplary embodiment, in addition to detecting the load state or no-load state of the output terminal OUT based on the comparison voltages VCOMP1 to VCOMPn, the control logic circuit 210 may calculate the amount of load connected to the output terminal OUT.

As illustrated in FIG. 18, a voltage charged to the output terminal OUT during a comparison operation may vary depending on the amount of load connected to the output terminal OUT. For example, it is assumed that a first load LOAD1 is smaller than a second load LOAD2, the second load LOAD2 is smaller than a third load LOAD3, and the third load LOAD3 is smaller than a fourth load LOAD4. A voltage of the output terminal OUT charged when the output terminal OUT is connected with the first load LOAD1 may be lower than a voltage of the output terminal OUT charged when the output terminal OUT is connected with the second load LOAD2 Likewise, as illustrated in FIG. 18, a voltage charged to the output terminal OUT may vary depending on the amount of load connected to the output terminal OUT. In this case, the first comparison voltage VCOMP1 to fourth comparison voltage VCOMP4 may be output by performing comparison operations by using the first reference voltage VREF1 to fourth reference voltage VREF4, respectively. Table 1 as follows shows exemplary result values of the first comparison voltage VCOMP1 to fourth comparison voltage VCOMP4 according to the amounts of load.

TABLE 1

|  | LOAD1 | LOAD2 | LOAD3 | LOAD4 |
| --- | --- | --- | --- | --- |
| VCOMP1 | HIGH | HIGH | HIGH | HIGH |
| VCOMP2 | LOW | HIGH | HIGH | HIGH |
| VCOMP3 | LOW | LOW | HIGH | HIGH |
| VCOMP4 | LOW | LOW | LOW | HIGH |

Referring to table 1, in the case where the first load LOAD1 is connected to the output terminal OUT, the first comparison voltage VCOMP1 may be a HIGH level, and each of the second to fourth comparison voltages VCOMP2 to VCOMP4 may be a LOW level. This means that a charging voltage of the output terminal OUT connected with the first load LOAD1 belongs between the first reference voltage VREF1 and the second reference voltage VREF2. That is, the control logic circuit 210 may calculate the amount of the first load LOAD1 based on the first comparison voltage VCOMP1 to fourth comparison voltage VCOMP4 Likewise, the first comparison voltage VCOMP1 to fourth comparison voltage VCOMP4 associated with the respective second load LOAD2 to fourth load LOAD4 may be output as illustrated in table 1. The control logic circuit 210 may calculate the amount of load connected to the output terminal OUT based on the first voltage VCOMP1 to fourth comparison voltage VCOMP4.

In an embodiment, the control logic circuit 210 may be configured to control a bias current, voltage, or signal of the operational amplifier 220 based on the amount of load calculated. For example, the control logic circuit 210 may be configured to control a bias current, voltage, or signal of the operational amplifier 220 such that power consumption is minimized according to the amount of load calculated.

Figure 19:
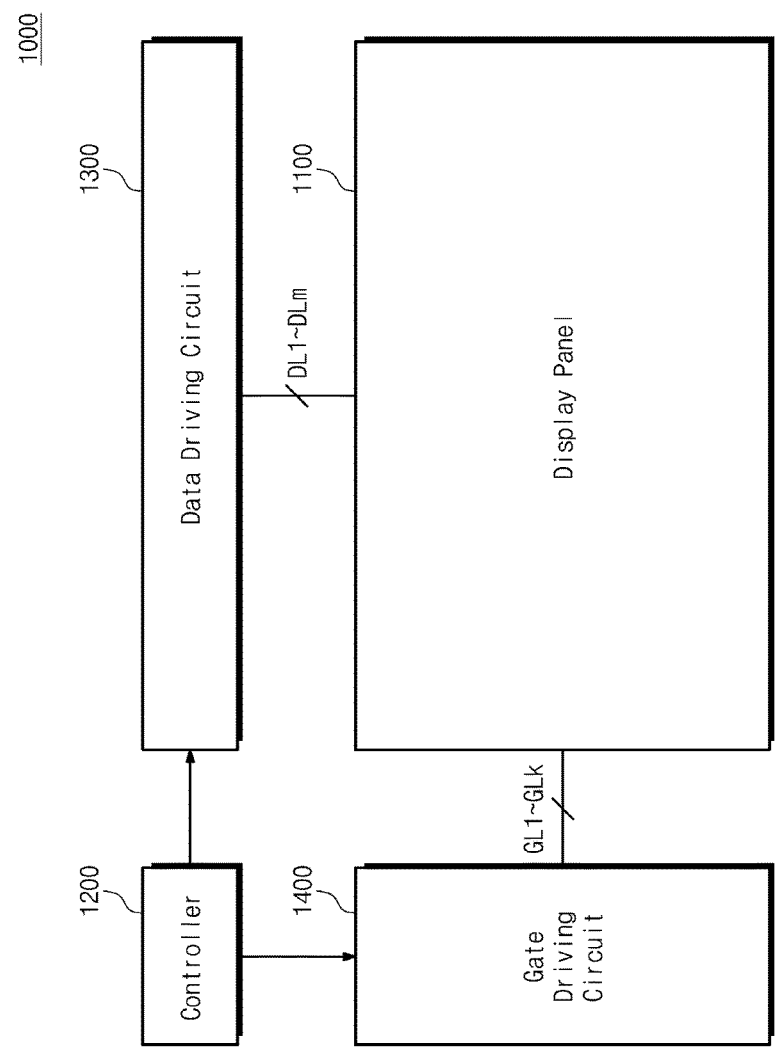
FIG. 19 is a block diagram illustrating a display device to which the operational amplifier circuit according to the present disclosure is applied.

FIG. 19 is a block diagram illustrating a display device to which an operational amplifier circuit according to the present disclosure is applied. Referring to FIG. 19, a display device 1000 may include a display panel 1100, a controller 1200, a data driving circuit 1300, and a gate driving circuit 1400.

The display panel 1100 may include multiple pixels (not illustrated) connected with multiple gate lines GL1 to GLk and multiple data lines DL1 to DLm. The pixels may be classified into multiple groups based on colors to be displayed. Each pixel may display one of primary colors. The primary colors may include, but not limited to, red, green, blue, and white. For example, the primary colors may further include various colors such as yellow, cyan, and magenta.

In an exemplary embodiment, the display panel 1100 may include various display panels such as a liquid crystal display panel, an organic light emitting display panel, an electrophoretic display panel, and an electrowetting display panel. However, the display panel 1100 according to the present disclosure may not be limited thereto. For example, the display panel 1100 according to the present disclosure may be implemented with the above-described display panels or other display panels. In an exemplary embodiment, the display device 1000 including the liquid crystal display panel may further include a polarizer (not illustrated), a backlight unit (not illustrated), etc.

The controller 1200 may control the data driving circuit 1300 and the gate driving circuit 1400 such that image information is displayed through the pixels. The controller 1200 may generate various control signals for controlling the data driving circuit 1300 and the gate driving circuit 1400. In an exemplary embodiment, the controller 1200 may be a timing controller (TCON).

The data driving circuit 1300 may be connected with the display panel 1100 (or the pixels included in the display panel 1100) through the data lines DL1 to DLm. The pixels included in the display panel 1100 may each be considered an external pixel relative to the data driving circuit 1300. The data driving circuit 1300 may provide data signals to the data lines DL1 to DLm under control of the controller 1200. In an exemplary embodiment, the data driving circuit 1300 may include an operational amplifier and a control logic circuit described with reference to FIGS. 1 to 18. The data driving circuit 1300 may provide data signals to the data lines DL1 to DLm by using the operational amplifier.

In an exemplary embodiment, the operational amplifier and the control logic circuit (or control circuit) included in the data driving circuit 1300 may operate based on an operation method described with reference to FIGS. 1 to 18. For example, the data driving circuit 1300 may include "n" operational amplifiers. In this case, "m" operational amplifiers (m being a natural number smaller than "n") among the "n" operational amplifiers may be connected with the data lines DL1 to DLm. That is, output terminals of the "m" operational amplifiers among the "n" operational amplifiers may be in a load state, and output terminals of (n−m) operational amplifiers may be in no-load state.

The control logic circuit (or control circuit) included in the data driving circuit 1300 may detect whether the output terminals of operational amplifiers are in a load state based on an operation method described with reference to FIGS. 1 to 18 and may selectively activate or deactivate the operational amplifiers based on the detection result.

In an exemplary embodiment, the above-described operation of the data driving circuit 1300 may initiate under control of the controller 1200. Alternatively, the above-described operation of the data driving circuit 1300 may initiate by an initialization operation or a power-on operation of the display device 1000 or by an explicit request of a user.

The gate driving circuit 1400 may be connected with the display panel 1100 (or the pixels included in the display panel 1100) through the gate lines GL1 to GLk. The pixels in the display panel 1100 may each be considered an external pixel relative to the gate driving circuit 1400. The gate driving circuit 1400 may provide gate signals to the gate lines GL1 to GLk under control of the controller 1200.

In an exemplary embodiment, the display panel 1100, the controller 1200, the data driving circuit 1300, and the gate driving circuit 1400 are respectively illustrated in FIG. 19 as separate function blocks (or intellectual properties (IPs) or intellectual property blocks (IP blocks). An IP block is a unit of logic, cell or integrated circuit that may be reusable and may be subject to intellectual property of a single party as a unique unit of logic, cell or integrated circuit. However, the scope and spirit of the present disclosure may not be limited thereto. For example, the controller 1200 and the data driving circuit 1300 may be integrated in one semiconductor chip, one semiconductor die, one semiconductor package, or one semiconductor module to form a display driving integrated circuit (DDI), and the gate driving circuit 1400 may be included in the display panel 1100. Alternatively, the controller 1200, the data driving circuit 1300, and the gate driving circuit 1400 may be integrated in one semiconductor chip, one semiconductor die, one semiconductor package, or one semiconductor module to form a display driving integrated circuit (DDI).

Figure 20:
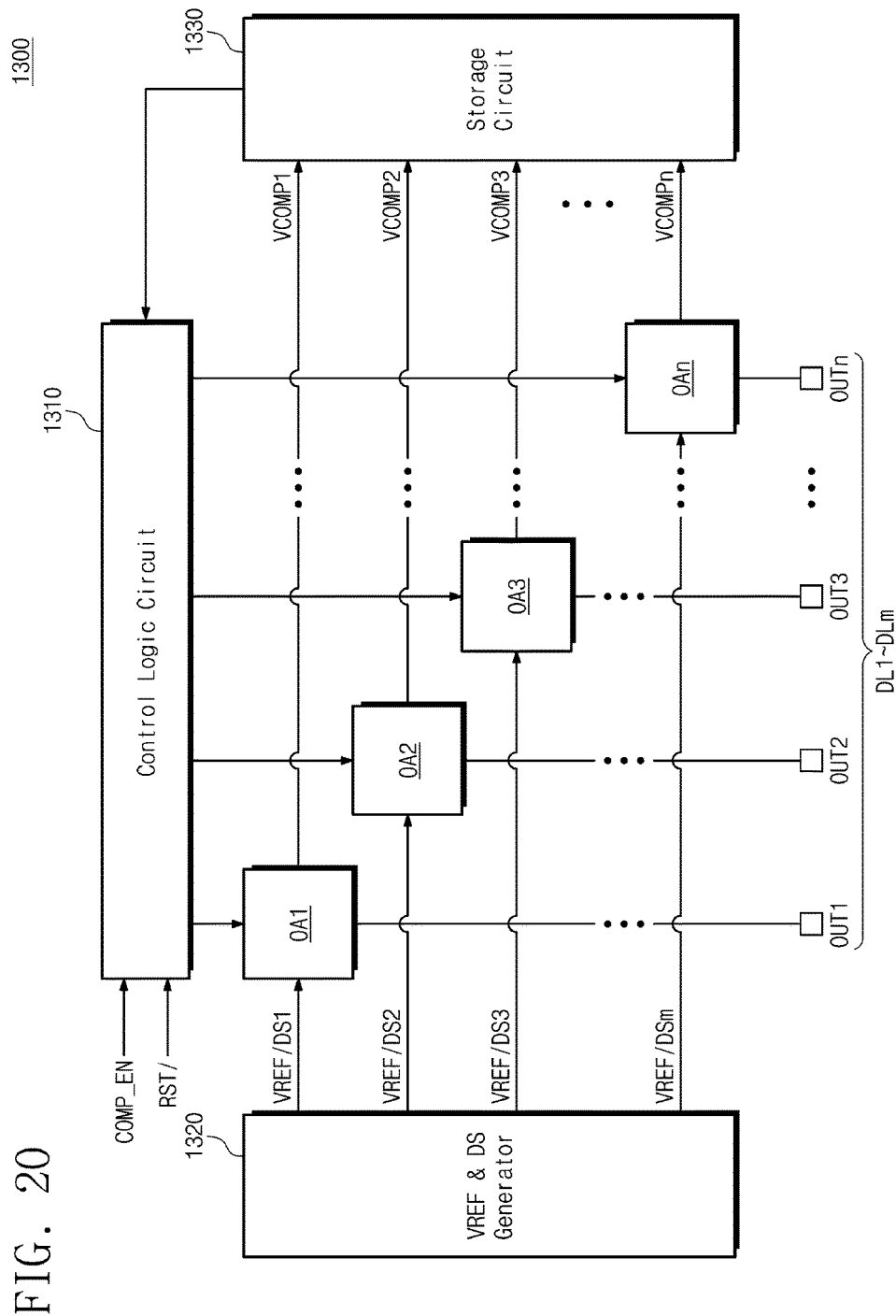
FIG. 20 is a block diagram illustrating a data driving circuit of FIG. 19 in detail.

FIG. 20 is a block diagram illustrating a data driving circuit of FIG. 19 in detail. Referring to FIGS. 19 and 20, the data driving circuit 1300 may include a control logic circuit (or control circuit) 1310, a reference voltage and data signal generator 1320, a storage circuit 1330, and first to n-th operational amplifiers OA1 to OAn.

The control logic circuit (or control circuit) 1310 may receive the comparison signal COMP_EN and the reset signal RST/ from the controller 1200. In an exemplary embodiment, the control logic circuit (or control circuit) 1310 may generate the comparison signal COMP_EN and the reset signal RST/ in response to other control signals (e.g., a power-on signal or a control signal for a reset operation or a comparison operation) of the controller 1200.

The control logic circuit (or control circuit) 1310 may control the first to n-th operational amplifiers OA1 to OAn respectively in response to the received signals such that the respective operational amplifiers OA1 to OAn perform the reset and comparison operations described with reference to FIGS. 1 to 18 and output the first comparison voltage VCOMP1 to n-th comparison voltage VCOMPn.

The reference voltage and data signal generator 1320 may provide corresponding data signals DS1 to DSn to the first to n-th operational amplifiers OA1 to OAn, respectively. The reference voltage and data signal generator 1320 may provide the reference voltage VREF to the respective first to n-th operational amplifiers OA1 to OAn. In an exemplary embodiment, the reference voltage VREF may refer to a reference voltage used to detect a load state or no-load state of each of output terminals OUT1 to OUTn of the first to n-th operational amplifiers OA1 to OAn, as described with reference to FIGS. 1 to 18. The data signals DS1 to DSn may refer to data signals to be provided to relevant pixels of the display panel 1100 through relevant operational amplifiers. In an exemplary embodiment, the reference voltage and data signal generator 1320 may include a voltage generator for generating the reference voltage VREF and a data decoder for generating data signals. The data decoder may decode a data signal from the controller 1200 to generate a voltage corresponding to the data signal.

The storage circuit 1330 may be configured to store information about the first to n-th comparison voltages VCOMP1 to VCOMPn from the first to n-th operational amplifiers OA1 to OAn. For example, the storage circuit 1330 may include an information storage device such as a fuse, a flip-flop (F/F), or a register. The storage circuit 1330 may be configured to store information about whether each of the first to n-th comparison voltages VCOMP1 to VCOMPn from the first to n-th operational amplifiers OA1 to OAn is a high level or a low level.

In an exemplary embodiment, the control logic circuit (or control circuit) 1310 may determine a load state or no-load state of each of the output terminals OUT1 to OUTn of the first to n-th operational amplifiers OA1 to OAn based on the information stored in the storage circuit 1330. The control logic circuit (or control circuit) may selectively activate each of the first to n-th operational amplifiers OA1 or deactivate each of the first to n-th operational amplifiers OA1 to OAn based on the determination result. Thus, the control logic circuit (or control logic circuit) may selectively activate each of the first to n-th operational amplifiers OA1 to OAn to be activated operational amplifiers, and may selectively deactivate each of the first to n-th operational amplifiers OA1 to OAn to be deactivated operational amplifiers.

The first to n-th operational amplifiers OA1 to OAn may be configured to perform the reset and comparison operations described with reference to FIGS. 1 to 18 under control of the control logic circuit (or control circuit) 1310 and output the first to n-th comparison voltages VCOMP1 to VCOMPn. As described above, levels of the first to n-th comparison voltages VCOMP1 to VCOMPn may be different from each other depending on whether the output terminals OUT1 to OUTn of the first to n-th operational amplifiers OA1 to OAn are in a load state or in no-load state.

The first to n-th operational amplifiers OA1 to OAn may perform the normal operation described with reference to FIGS. 1 to 18 under control of the control logic circuit (or control circuit) 1310. For example, the first to n-th operational amplifiers OA1 to OAn may respectively receive and amplify the corresponding data signals DS1 to DSn from the reference voltage and data signal generator 1320 and may output the amplified data signals DS1 to DSn to the output terminals OUT1 to OUTn, respectively. In an exemplary embodiment, some output terminals of the output terminals OUT1 to OUTn may be connected with the data lines DL1 to DLm. In an exemplary embodiment, an operational amplifier including an output terminal not connected with a load (e.g., a data line) (i.e., an output terminal of no-load state) may be deactivated by the control logic circuit (or control circuit) 1310. The deactivated operational amplifier may not receive a relevant data signal or may not amplify a received data signal.

Figure 21:
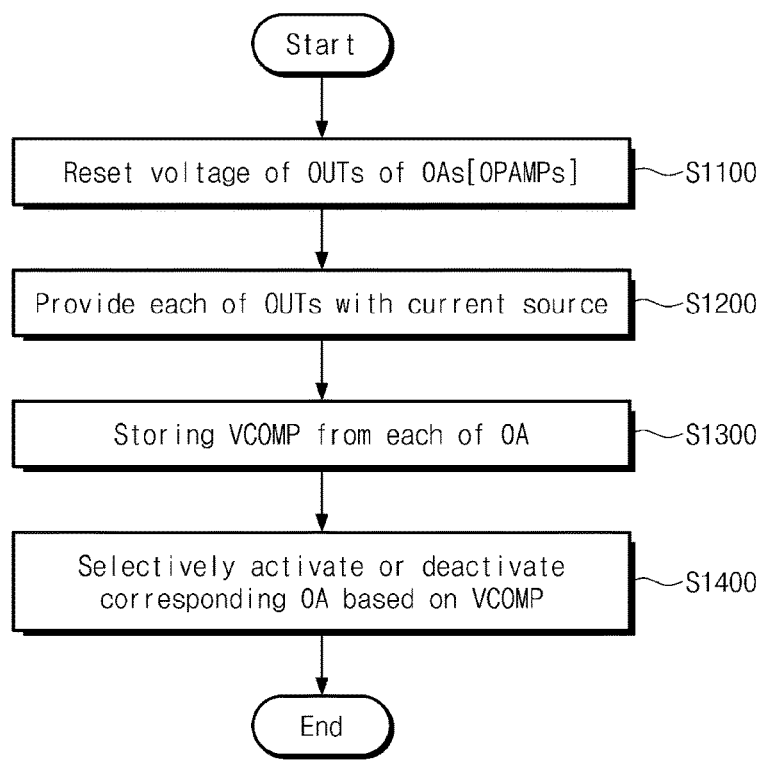
FIG. 21 is a flowchart illustrating an operation of the data driving circuit of FIG. 19.
Figure 22:
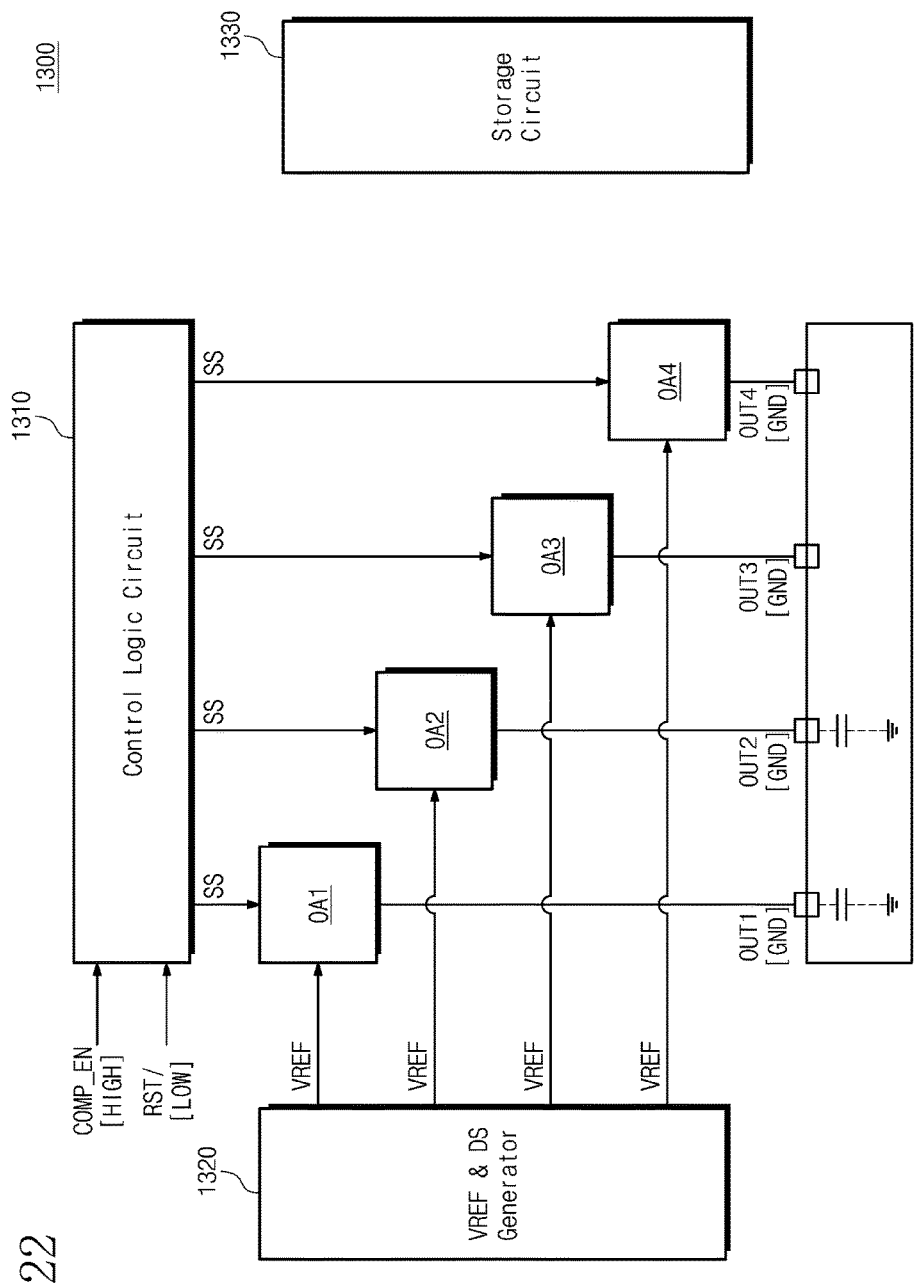
FIG. 22 is a view for describing operation S1100 of FIG. 21.
Figure 23:
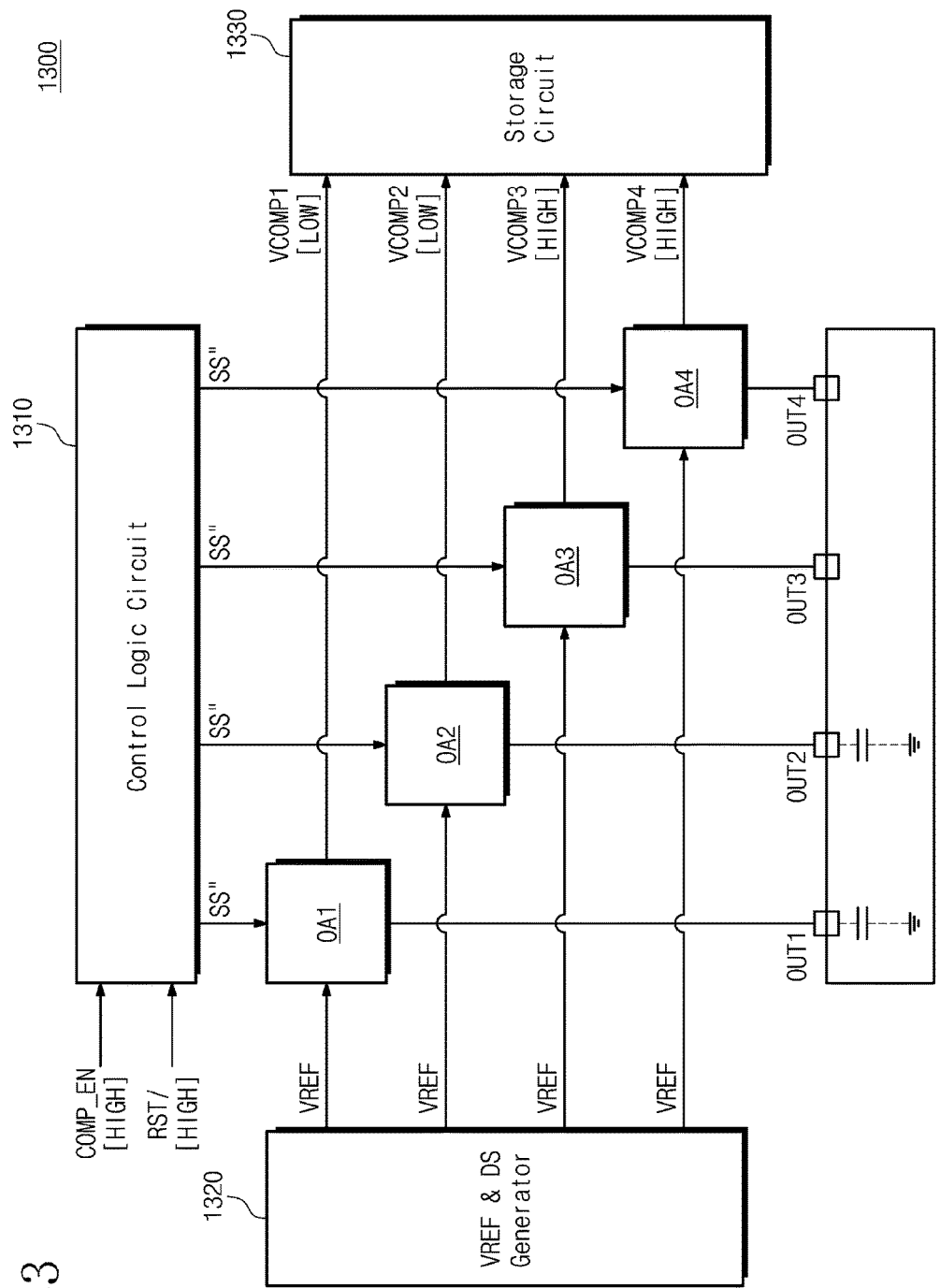
FIG. 23 is a view for describing operation S1200 and operation S1300 of FIG. 21.
Figure 24:
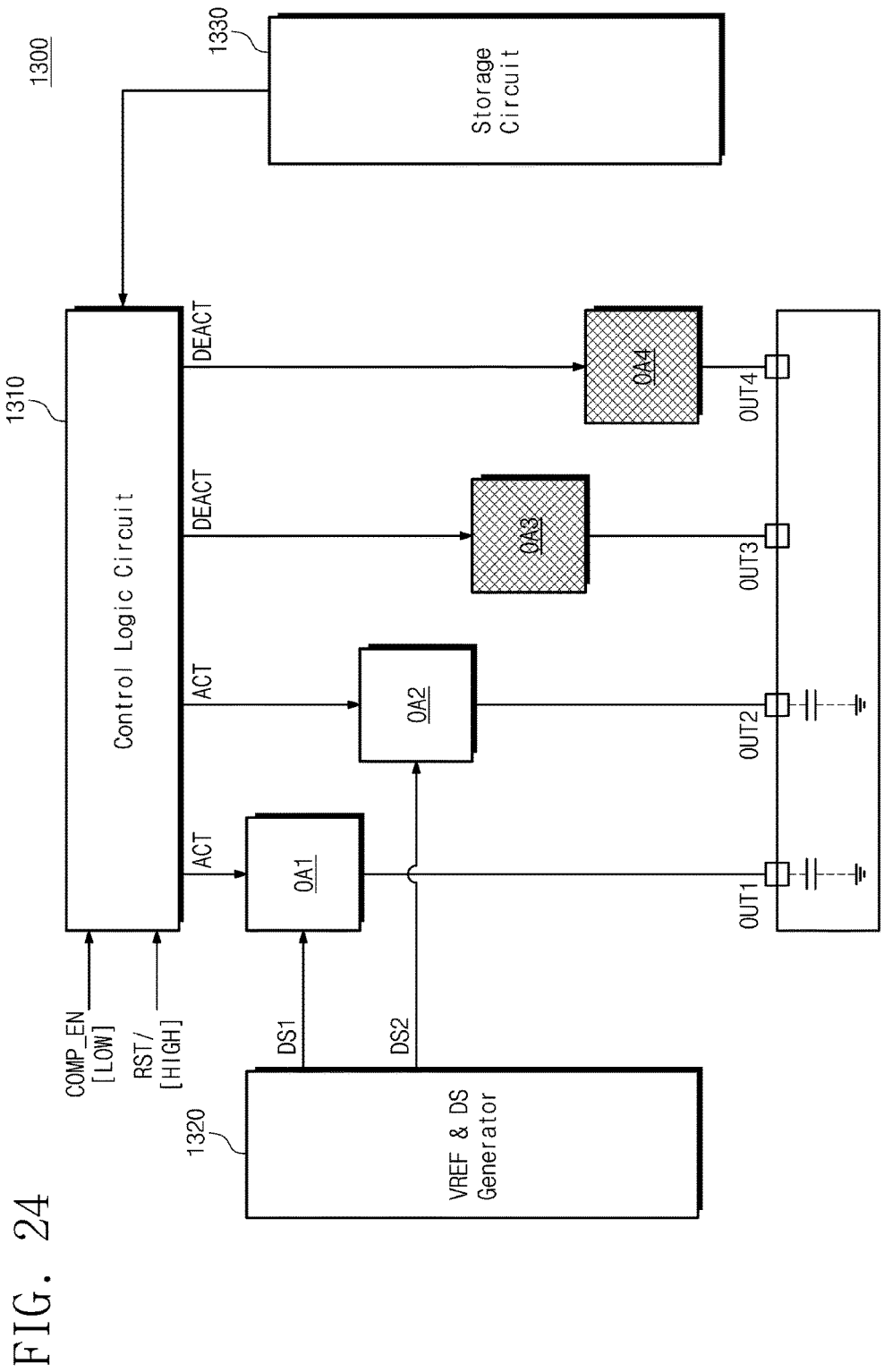
FIG. 24 is a view for describing operation S1400 of FIG. 21.

FIG. 21 is a flowchart illustrating an operation of a data driving circuit of FIG. 19. FIG. 22 is a view for describing operation S1100 of FIG. 21. FIG. 23 is a view for describing operation S1200 and operation S1300 of FIG. 21. FIG. 24 is a view for describing operation S1400 of FIG. 21.

For brevity of illustration and for convenience of description, it is assumed that the data driving circuit 1300 includes first operational amplifier OA1 to fourth operational amplifier OA4, each of output terminal OUT1 of the first operational amplifier OA1 and output terminal OUT2 of the second operational amplifier OA2 is connected with a load (i.e., a data line or a pixel). Each of the third operational amplifier OA3 and the fourth operational amplifier OA4 is not connected with a load. However, the scope and spirit of the present disclosure may not be limited thereto. For example, the data driving circuit 1300 may further include operational amplifiers. Additionally, a load state or no-load state of output terminals may be variously changed according to implementation of the display device 1000.

Referring to FIGS. 19 to 21, in operation S1100, the data driving circuit 1300 may reset voltages of the output terminals OUT1 to OUT4 of the operational amplifiers OA1 to OA4. For example, each of the first operational amplifier OA1 to fourth operational amplifier OA4 of the data driving circuit 1300 may perform the reset operation described with reference to FIGS. 1 to 18 under control of the control logic circuit (or control circuit) 1310.

As a detailed example, referring to FIG. 22, the control logic circuit (or control circuit) 1310 may generate multiple switching signals SS in response to the comparison signal COMP_EN of a HIGH level and the reset signal RST/ of a LOW level and may provide the switching signals SS to the first operational amplifier OA1 to fourth operational amplifier OA4, respectively. The first operational amplifier OA1 to fourth operational amplifier OA4 may respectively reset the output terminals OUT1 to OUT4 to a preset voltage (e.g., the ground voltage GND) in response to the switching signals SS.

In an exemplary embodiment, the first operational amplifier OA1 to fourth operational amplifier OA4 may respectively reset the output terminals OUT1 to OUT4 to the ground voltage GND as described with reference to FIGS. 3 and 5. Alternatively, the first operational amplifier OA1 to fourth operational amplifier OA4 may respectively reset the output terminals OUT1 to OUT4 to the power supply voltage VDD as described with reference to FIGS. 11A to 11C.

In operation S1200, the data driving circuit 1300 may provide a current source to each of the first operational amplifier OA1 to fourth operational amplifier OA4. In operation S1300, the data driving circuit 1300 may store the first comparison voltage VCOMP1 to fourth comparison voltage VCOMP4 from the first operational amplifier OA1 to fourth operational amplifier OA4.

For example, referring to FIG. 23, the control logic circuit (or control circuit) 1310 may generate multiple switching signals SS' in response to the comparison signal COMP_EN of a HIGH level and the reset signal RST/ of a HIGH level and may provide the switching signals SS' to the first operational amplifier OA1 to fourth operational amplifier OA4, respectively. The first operational amplifier OA1 to fourth operational amplifier OA4 may respectively charge the output terminals OUT1 to OUT4 each as a charged output terminal through the current sources in response to the switching signals SS', as described with reference to FIG. 7. The first operational amplifier OA1 to fourth operational amplifier OA4 may output the first comparison voltage VCOMP1 to fourth comparison voltage VCOMP4 as results of comparing voltages of the output terminals OUT1 to OUT4 with the reference voltage VREF.

In this case, as described above, since the output terminals OUT1 and OUT2 of the first operational amplifier OA1 and second operational amplifier OA2 are in the load state, the first comparison voltage VCOMP1 and second comparison voltage VCOMP2 may be a LOW level. In contrast, since the output terminals OUT3 and OUT4 of the third operational amplifier OA3 and fourth operational amplifier OA4 are in no-load state, the third comparison voltage VCOMP3 and fourth comparison voltage VCOMP4 may be a HIGH level. The storage circuit 1330 may store information about the first comparison voltage VCOM1 to fourth comparison voltage VCOMP4. In an exemplary embodiment, a level of each voltage is exemplary, and a level of each comparison voltage may be variously changed according to the embodiments described with reference to FIGS. 1 to 18.

In operation S1400, the data driving circuit 1300 may selectively activate or deactivate a relevant operational amplifier based on the comparison voltage VCOMP. In an exemplary embodiment, as illustrated in FIG. 24, the control logic circuit (or control circuit) 1310 may selectively activate or deactivate the first operational amplifier OA1 to fourth operational amplifier OA4 based on the information stored in the storage circuit 1330, in response to the comparison signal COMP_EN of a LOW level and the reset signal RST/ of a HIGH level. Thus, the control logic circuit (or control circuit) 1310 may selectively activate the first operational amplifier OA1 to fourth operational amplifier OA4 to be activated operational amplifiers, and may selectively deactivate the first operational amplifier OA1 to fourth operational amplifier OA4 to be deactivated operational amplifiers For example, the storage circuit 1330 may include information representing that the first comparison voltage VCOMP1 and second comparison voltage VCOMP2 are a LOW level and information representing that the third comparison voltage VCOMP3 and fourth comparison voltage VCOMP4 are a HIGH level. The stored information means that the output terminals OUT1 and OUT2 of the first operational amplifier OA1 and second operational amplifier OA2 are in the load state and the output terminals OUT3 and OUT4 of the third operational amplifier OA3 and fourth operational amplifier OA4 is in no-load state. On the basis of the information stored in the storage circuit 1330, the control logic circuit (or control circuit) 1310 may activate the first operational amplifier OA1 and second operational amplifier OA2 each including an output terminal of the load state to be activated operational amplifiers. The control logic circuit (or control circuit) 1310 may deactivate the third and fourth operational amplifiers OA3 and OA4 each including an output terminal of no-load state to be deactivated operational amplifiers.

The first operational amplifier OA1 and the second operational amplifier OA2 once activated may receive the first data signal DS1 and the second data signal DS2 from the reference voltage and data signal generator 1320. The first operational amplifier OA1 and the second operational amplifier OA2 may amplify the first data signal DS1 and the second data signal DS2, and may output the amplified data signals to the output terminals OUT1 and OUT2. The third operational amplifier OA3 and the fourth operational amplifier OA4 once deactivated may not receive a separate data signal from the reference voltage and data signal generator 1320. Alternatively, the third operational amplifier OA3 and the fourth operational amplifier OA4 once deactivated may not perform a separate amplification operation.

In an exemplary embodiment, to activate or deactivate the first operational amplifier OA1 to fourth operational amplifier OA4, the control logic circuit (or control circuit) 1310 may provide an enable signal ACT and a disable signal DEACT to the first operational amplifier OA1 to fourth operational amplifier OA4. In an exemplary embodiment, the disable signal DEACT may be a bias voltage, current, or signal instructing or otherwise causing various elements of an operational amplifier not to operate. That is, the disable signal DEACT may disable the various elements of the operational amplifier not to operate, or otherwise cause or allow the various elements of the operational amplifier not to operate. Alternatively, the disable signal DEACT may mean that a separate signal is not provided to an operational amplifier.

In an exemplary embodiment, although not illustrated in drawings, the data driving circuit 1300 may detect the amount of load connected to an output terminal, as described with reference to FIGS. 17 and 18. The data driving circuit 1300 may adjust the enable signal ACT depending on the amount of load detected such that power consumption of an operational amplifier OA is minimized.

As described above, a data driving circuit according to the present disclosure may detect whether a load is connected to an output terminal by using an operational amplifier itself without a separate load detection circuit and may selectively activate or deactivate the operational amplifier depending on the detection result. Accordingly, a data driving circuit is provided with reduced power consumption, improved reliability, and improved performance. Additionally, a display device is provided with the data driving circuit.

Figure 25:
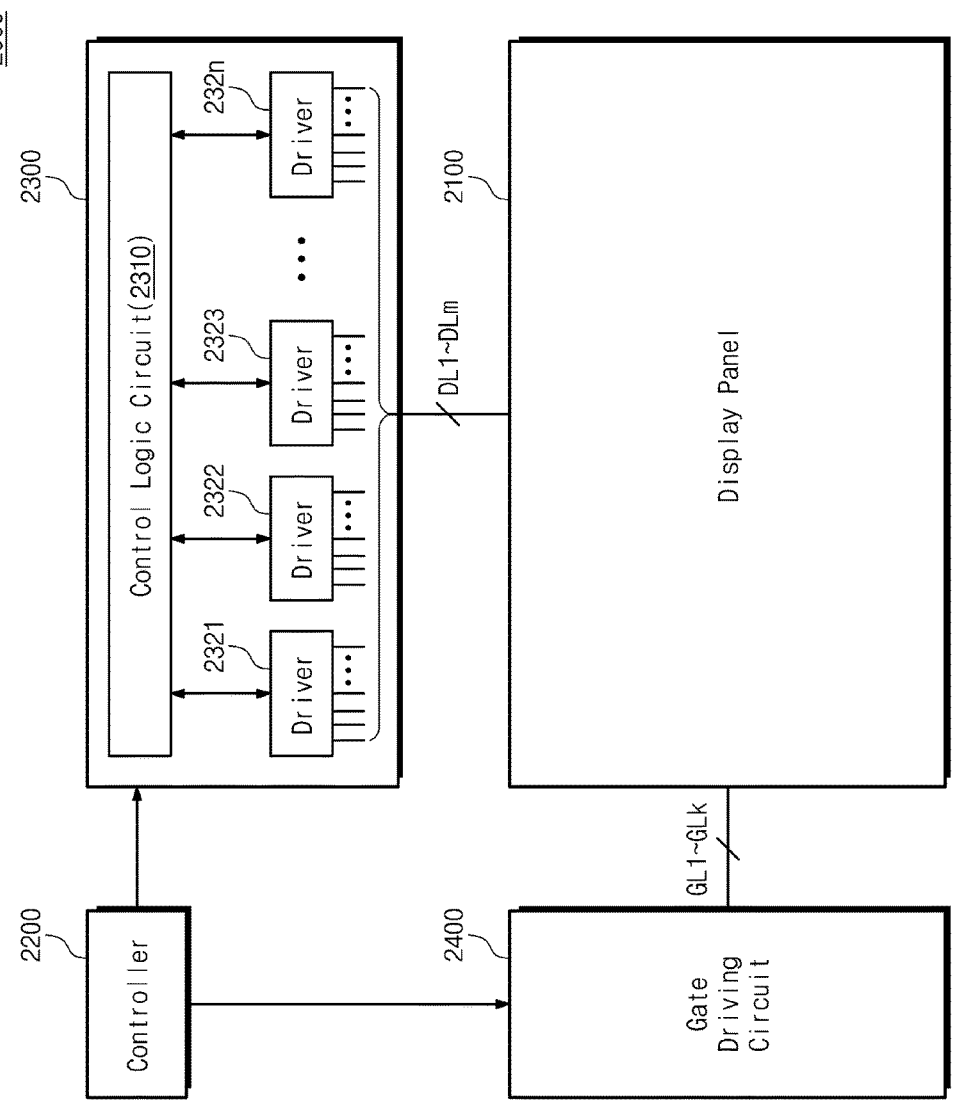
FIG. 25 is a block diagram illustrating a display device to which the operational amplifier circuit according to the present disclosure is applied.

FIG. 25 is a block diagram illustrating a display device to which an operational amplifier circuit according to the present disclosure is applied. Referring to FIG. 25, a display device 2000 may include a display panel 2100, a controller 2200, a data driving circuit 2300, and a gate driving circuit 2400. The display panel 2100, the controller 2200, and the gate driving circuit 2400 are described above, and thus, a detailed description thereof will not be repeated here.

Referring to FIG. 25, the data driving circuit 2300 may include a control logic circuit (or control circuit) 2310 and multiple drivers 2321 to 232n. Each of the drivers 2321 to 232n may include multiple operational amplifiers. Each of the operational amplifiers may be an operational amplifier or an operational amplifier circuit described with reference to FIGS. 1 to 18. A part of output terminals of each of the drivers 2321 to 232n may be connected with multiple data lines DL1 to DLn. A part of output terminals of some of the drivers 2321 to 232n may not be connected with data lines. For example, a part of output terminals of the drivers 2321 and 2322 may not be connected with data lines. In this case, the drivers 2321 and 2322 may detect an operational amplifier not connected with a data line based on an operation method described with reference to FIGS. 1 to 18 under control of the control logic circuit (or control circuit) 2310 and may deactivate the detected operational amplifier.

As described above, the display device 2000 may include the drivers 2321 to 232n, which include multiple operational amplifiers or multiple operational amplifier circuits. Each of the drivers 2321 to 232n may operate based on an operation method described with reference to FIGS. 1 to 18.

Although not illustrated in FIG. 25, the data driving circuit 2300 may further include the above-described components such as a reference voltage generator, a data signal decoder, and a storage circuit.

Figure 26:
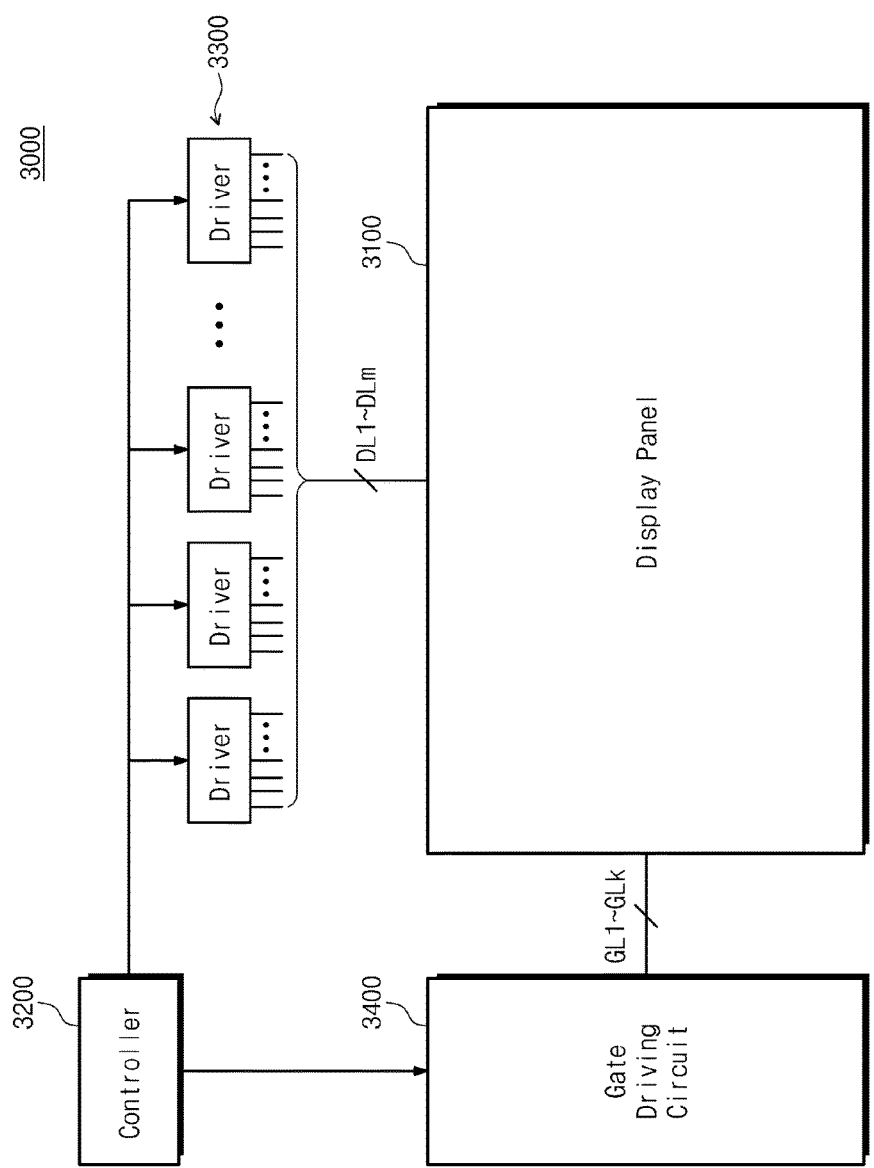
FIG. 26 is a block diagram illustrating a display device to which the operational amplifier circuit according to the present disclosure is applied.

FIG. 26 is a block diagram illustrating a display device to which an operational amplifier circuit according to the present disclosure is applied. Referring to FIG. 26, a display device 3000 may include a display panel 3100, a controller 3200, multiple drivers 3300, and a gate driving circuit 3400. The display panel 3100, the controller 3200, and the gate driving circuit 3400 are described above, and thus, a detailed description thereof will not be repeated here.

The display device 3000 of FIG. 26 may not include a separate control logic circuit (or control circuit) compared with the display device 2000 of FIG. 25. In an exemplary embodiment, a configuration of the control logic circuit (or control circuit) may be included in the controller 3200. In this case, the drivers 3300 may operate depending on an operation method described with reference to FIGS. 1 to 18.

Alternatively, each of the drivers 3300 may be configured to include the configuration of the control logic circuit (or control circuit). In this case, each of the controllers 3200 may operate depending on an operation method described with reference to FIGS. 1 to 18 under control of the control logic circuit (or control circuit) included therein.

Although not illustrated in FIG. 26, the above-described components such as a reference voltage generator, a data signal decoder, and a storage circuit may be included in the controller 3200 or each of the drivers 3300 or may be implemented with a separate device.

Figure 27:
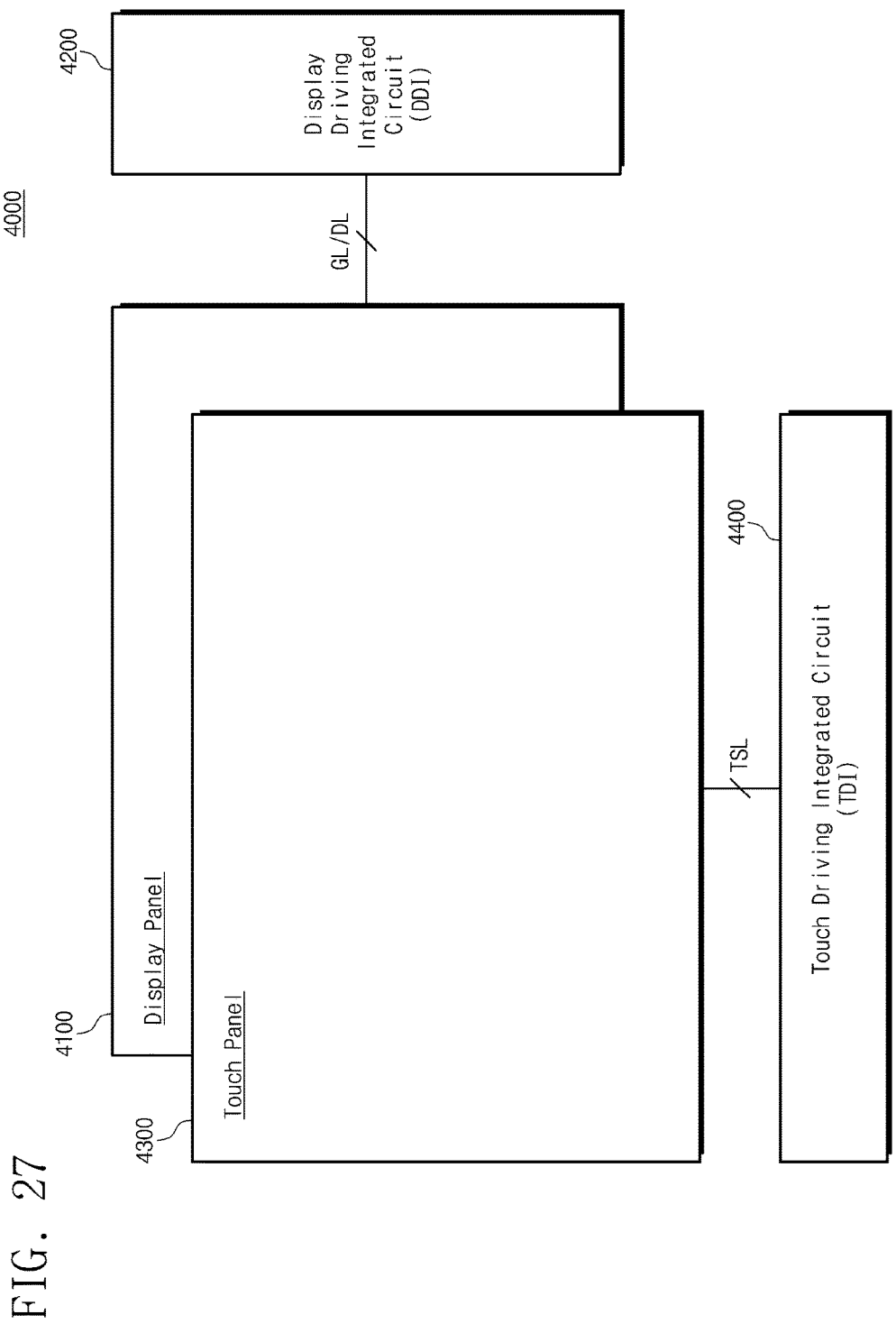
FIG. 27 is a block diagram illustrating a touch display device to which the operational amplifier circuit according to the present disclosure is applied.

FIG. 27 is a block diagram illustrating a touch display device to which an operational amplifier circuit according to the present disclosure is applied. Referring to FIG. 27, a touch display device 4000 may include a display panel 4100, a DDI 4200 (i.e., a display driving integrated circuit), a touch panel 4300, and a TDI 4400 (i.e., a touch driving integrated circuit).

The display panel 4100 is described with reference to FIG. 19, and thus, a detailed description thereof will not be repeated here.

The DDI 4200 is connected with the display panel 4100 through multiple data lines DL and multiple gate lines GL. The DDI 4200 may control the data lines DL and the gate lines GL to display image information through the display panel 4100. In an exemplary embodiment, the DDI 4200 may include a controller, a data driving circuit, and a gate driving circuit described with reference to FIGS. 19 to 25 or a combination thereof.

In an exemplary embodiment, the DDI 4200 may include an operational amplifier or an operational amplifier circuit according to the present disclosure and may operate based on an operation method described with reference to FIGS. 1 to 25.

The touch panel 4300 may include touch sensing lines TSL arranged in various manners. The TDI 4400 may be connected with the touch panel 4300 through the touch sensing lines TSL. The TDI 4400 may provide a touch signal through the touch sensing lines TSL and may obtain coordinate information of a user's touch or coordinate information an area where the user's touch is made, based on the touch signal received through the touch sensing lines TSL.

In an exemplary embodiment, the TDI 4400 may include multiple operational amplifiers for the purpose of providing the touch signal through the touch sensing lines TSL. Each of the operational amplifiers may be an operational amplifier or an operational amplifier circuit described with reference to FIGS. 1 to 25 and may operate based on an operation method described with reference to FIGS. 1 to 25.

In an exemplary embodiment, the touch panel 4300 and the TDI 4400 may be variously changed according to a way to implement touch display device 4000. For example, as illustrated in FIG. 27, the display panel 4100 and the touch panel 4300 may be implemented in an out-cell type in which they are formed on separate semiconductor substrates. Alternatively, although not illustrated in FIG. 27, the display panel 4100 and the touch panel 4300 may be implemented in an in-cell type or an on-cell type in which they are formed on the same semiconductor substrate. Alternatively, the touch panel 4300 and the TDI 4400 may be configured to sense a user's touch based on a self-capacitance manner or a mutual capacitance manner.

According to exemplary embodiments of the present disclosure, an operational amplifier circuit may automatically detect a load state and may activate or deactivate an operational amplifier based on the detection result. As the operational amplifier circuit according to the present disclosure is applied to a data driving circuit of a display device or any other application fields, an operational amplifier may be activated or deactivated according to a load state, thereby reducing power consumption and improving performance and reliability of a device.

According to the present disclosure, an operational amplifier circuit may automatically detect a load state and may be activated or deactivated according to the detection result. Accordingly, since a display device including the operational amplifier circuit according to the present disclosure does not need a separate configuration for load detection, it is possible to provide the operational amplifier circuit with reduced costs, reduced power consumption, improved performance, and improved reliability. Additionally, it is possible with the teachings of the present disclosure to provide a data driving circuit including the operational amplifier circuit, and operation methods of the operational amplifier circuit and the data driving circuit.

While the present disclosure has been described with reference to exemplary embodiments thereof, it will be apparent to those of ordinary skill in the art that various changes and modifications may be made thereto without departing from the spirit and scope of the present disclosure as set forth in the following claims.

What is claimed is:

1. An operational amplifier circuit, comprising:
an operational amplifier including a first input terminal, a second input terminal, and an output terminal connected with the second input terminal, and configured to amplify a signal provided through the first input terminal and to output the amplified signal through the output terminal; and
a control circuit configured to generate a plurality of switching signals,
wherein the operational amplifier is further configured to:
in response to the plurality of switching signals,
reset the output terminal to a preset voltage;
charge the reset output terminal; and
compare a voltage of the charged output terminal with a reference voltage provided through the first input terminal, to output a comparison voltage.

2. The operational amplifier circuit of claim 1, wherein the operational amplifier further includes:
an input stage connected with the first input terminal and the second input terminal;
an output stage connected with the output terminal;
a switch stage configured to connect the input stage and the output stage in response to first switching signals of the plurality of switching signals;
a reset stage configured to reset the output terminal to the preset voltage in response to a second switching signal of the plurality of switching signals; and
a current source stage configured to charge the output terminal in response to a third switching signal of the plurality of switching signals.

3. The operational amplifier circuit of claim 2, wherein the output terminal is reset to the preset voltage when the switch stage separates the input stage and the output stage from each other in response to the first switching signals, the reset stage is connected with the output stage in response to the second switching signal, and the current source stage is separated from the output stage in response to the third switching signal.

4. The operational amplifier circuit of claim 2, wherein the output terminal is charged when the switch stage separates the input stage and the output stage from each other in response to the first switching signals, the reset stage is separated from the output stage in response to the second switching signal, and the current source stage is connected with the output stage in response to the third switching signal.

5. The operational amplifier circuit of claim 2, wherein the amplified signal is output through the output terminal when the switch stage connects the input stage and the output stage in response to the first switching signals, the reset stage is separated from the output stage in response to the second switching signal, and the current source stage is separated from the output stage in response to the third switching signal.

6. The operational amplifier circuit of claim 2, wherein the comparison voltage is output from the input stage.

7. The operational amplifier circuit of claim 2, wherein the switch stage includes:
first to fourth switches configured to connect the input stage and the output stage in response to the first switching signals.

8. The operational amplifier circuit of claim 2, wherein the output stage includes a first transistor connected between the output terminal and a ground voltage,
wherein the reset stage includes a reset switch configured to connect a gate of the first transistor and a power supply voltage in response to the second switching signal, and
wherein the current source stage includes:
a current source connected between the output terminal and the power supply voltage; and
a charging switch configured to connect the output terminal and the current source.

9. The operational amplifier circuit of claim 1, wherein, if a load is connected to the output terminal, the comparison voltage is a first level, and
wherein, if the load is not connected to the output terminal, the comparison voltage is a second level different from the first level.

10. The operational amplifier circuit of claim 1, wherein the control circuit is configured to:
selectively activate or deactivate the operational amplifier based on the comparison voltage.

11. An operation method of an operational amplifier circuit which includes an operational amplifier and a control circuit, the method comprising:
resetting a voltage of an output terminal of the operational amplifier to a preset voltage;

providing a current source to the output terminal to charge the output terminal;

comparing a first charging voltage of the output terminal with a first reference voltage provided through an input terminal of the operational amplifier, to output a first comparison voltage; and selectively activating or deactivating the operational amplifier based on the first comparison voltage.

12. The method of claim 11, wherein, if a load is connected to the output terminal, the first comparison voltage is a first level, and wherein, if the load is not connected to the output terminal, the first comparison voltage is a second level different from the first level.

13. The method of claim 12, wherein the load includes a data line or a pixel of an external display device.

14. The method of claim 12, wherein, if the first comparison voltage is the first level, the operational amplifier is activated, and wherein, if the first comparison voltage is the second level, the operational amplifier is deactivated.

15. The method of claim 11, wherein the operational amplifier activated amplifies a signal from the outside as an amplified signal and outputs the amplified signal through the output terminal.

* * * * *